United States Patent [19]

Itoyama et al.

[11] Patent Number: 5,707,459
[45] Date of Patent: Jan. 13, 1998

[54] SOLAR CELL MODULE PROVIDED WITH A HEAT-FUSED PORTION

[75] Inventors: Shigenori Itoyama, Nara; Takahiro Mori, Ikoma; Ichiro Kataoka; Satoru Yamada, both of Tsuzuki-gun, all of Japan

[73] Assignee: Canon Kabushiki Kaisha, Tokyo, Japan

[21] Appl. No.: 538,346

[22] Filed: Oct. 3, 1995

Related U.S. Application Data

[63] Continuation of Ser. No. 263,887, Jun. 22, 1994, abandoned.

[30] Foreign Application Priority Data

Jun. 24, 1993 [JP] Japan .................. 5-153737

[51] Int. Cl.$^6$ .................. H01L 31/048; E04D 13/18
[52] U.S. Cl. .................. 136/251; 136/259; 257/433
[58] Field of Search .................. 136/251, 259; 257/433

[56] References Cited

U.S. PATENT DOCUMENTS

| | | | |
|---|---|---|---|
| 5,232,518 | 8/1993 | Nath et al. | 136/251 |
| 5,480,494 | 1/1996 | Inoue | 136/251 |

FOREIGN PATENT DOCUMENTS

| | | | |
|---|---|---|---|
| 60-42854 | 3/1985 | Japan | 136/251 |
| 60-214550 | 10/1985 | Japan | 136/251 |
| 4-101465 | 4/1992 | Japan | 136/251 |

*Primary Examiner*—Aaron Weisstuch
*Attorney, Agent, or Firm*—Fitzpatrick, Cella, Harper & Scinto

[57] ABSTRACT

A solar cell module comprising a solar cell encapsulated through a filler between a surface protective layer and a back face protective layer, characterized in that said surface protective layer is welded to said back face protective layer by way of heat fusion to provide a heat fused portion at at least a side end portion of said solar cell. The solar cell module may be provided with a moisture preventive layer disposed above the solar cell and under the surface protective layer. Further, the solar cell module may be provided with a back face reinforcing member disposed under the back face protective layer.

The solar cell module excels particularly in moisture resistance and stably and continuously exhibits a desirable photoelectric conversion efficiency even upon repeated use over a long period of time under severe environmental conditions of high temperature and high humidity.

58 Claims, 21 Drawing Sheets

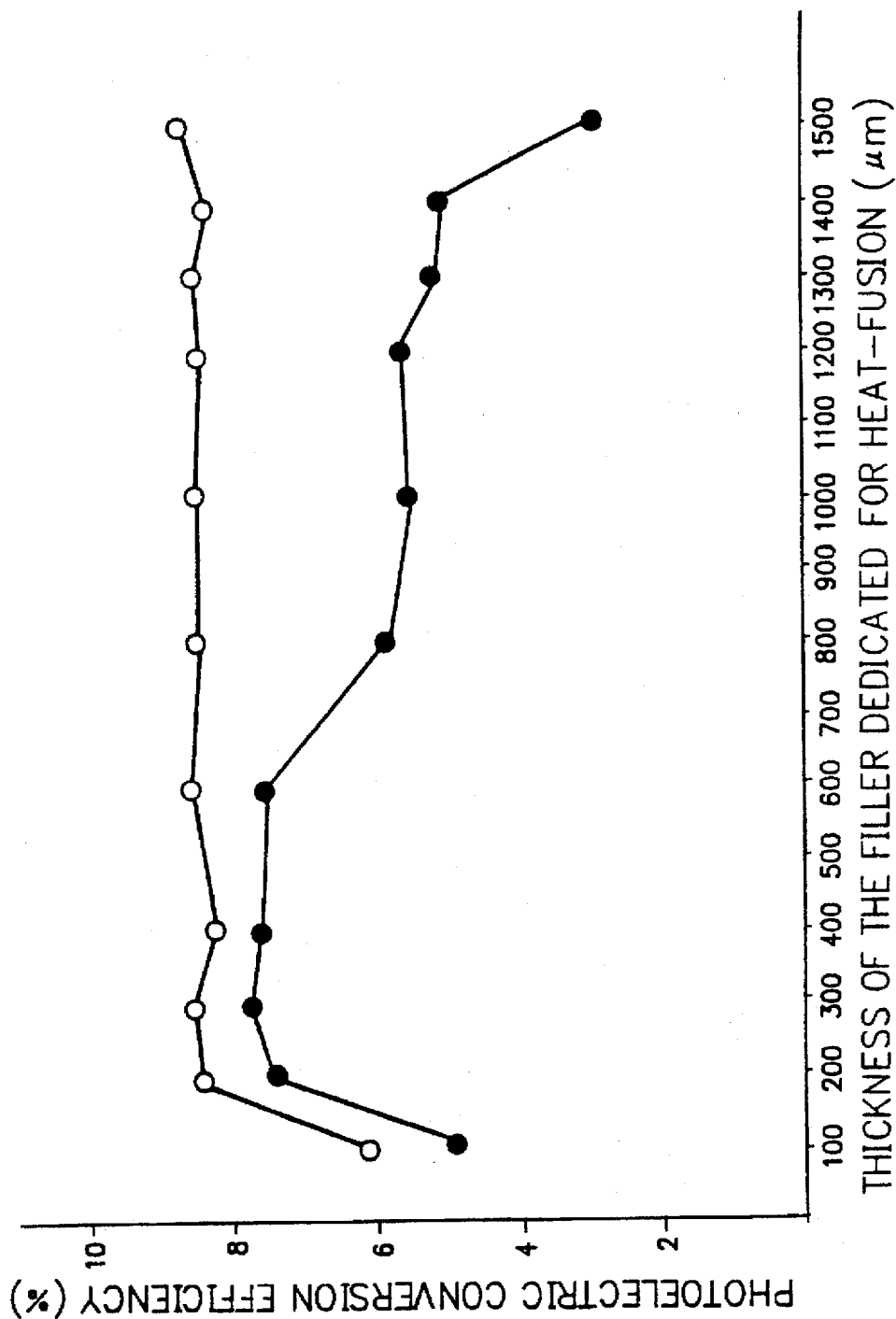

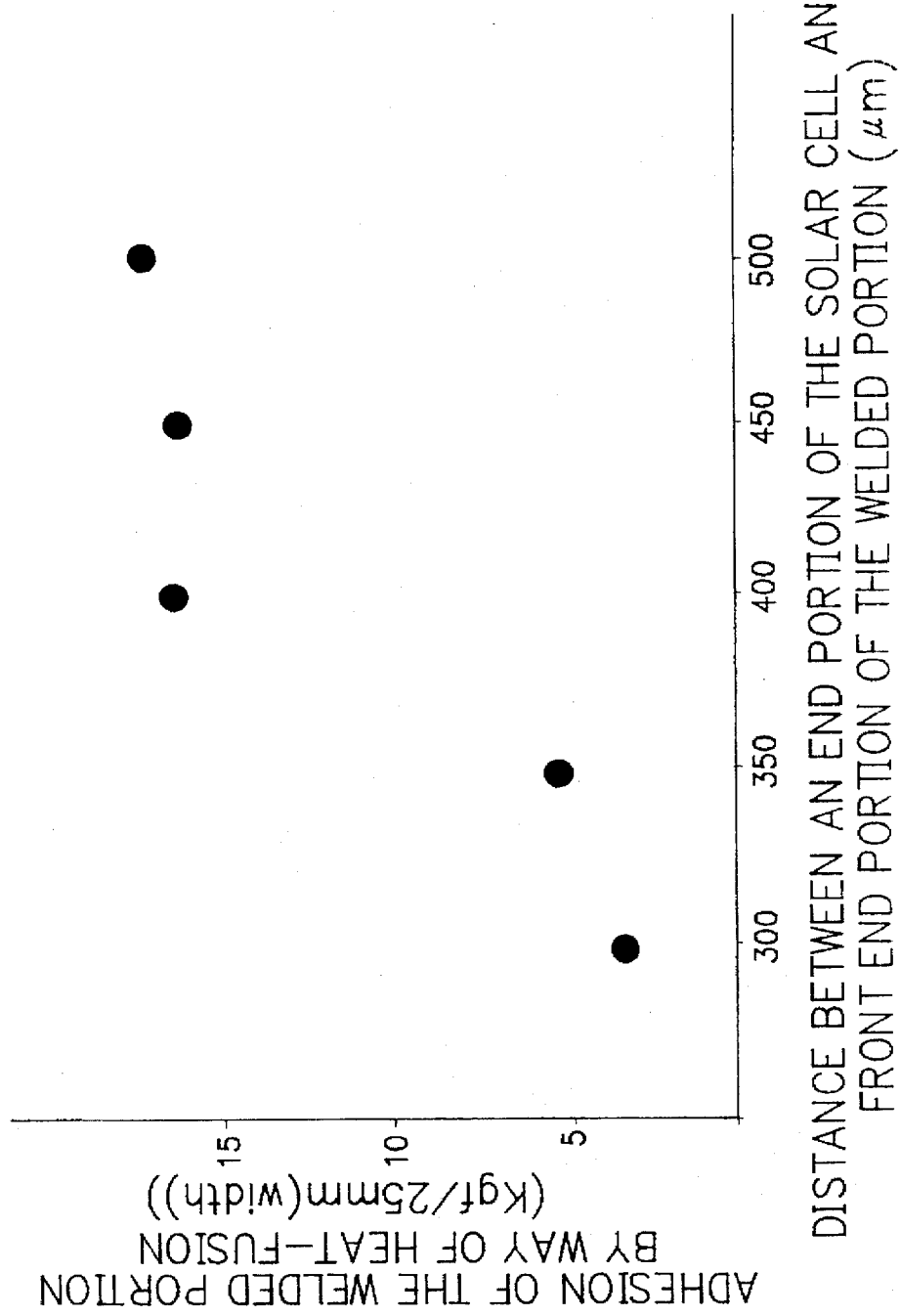

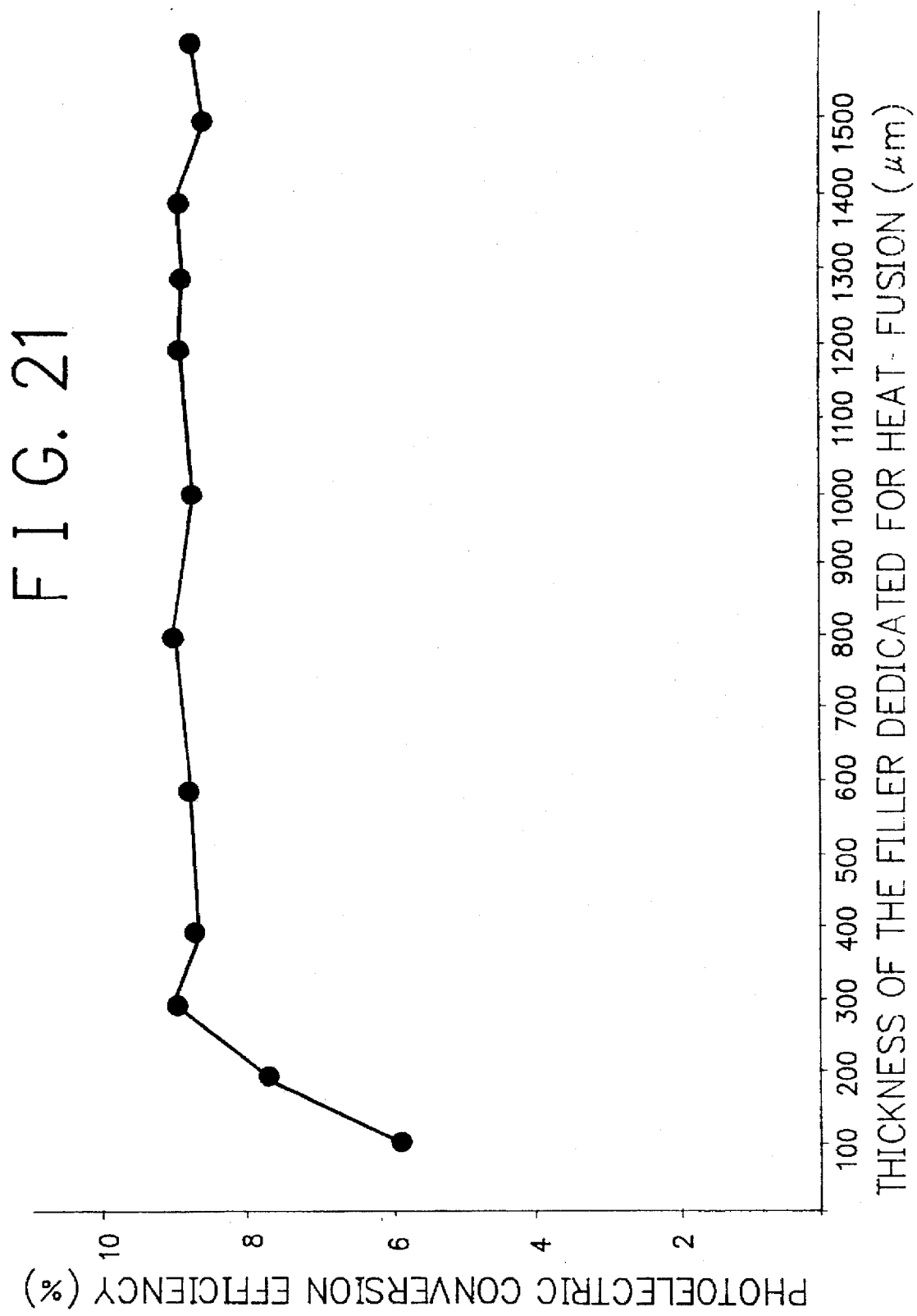

SOLAR CELL MODULE PROVIDED WITH A HEAT-FUSED PORTION

This application is a continuation of application Ser. No. 08/263,887 filed Jun. 22, 1994, now abandoned.

BACKGROUND OF THE INVENTION

1. Field of the Invention

The present invention relates to an improved reliable solar cell module which excel in weatherability and continuously exhibits a desirable photoelectric conversion efficiency without being deteriorated even upon repeated use over a long period of time under severe environmental conditions of high temperature and high humidity. More particularly, the present invention relates to an improved solar cell module comprising a solar cell encapsulated using a filler and a sealing film which particularly excels in moisture resistance and is hardly deteriorated in terms of the photoelectric conversion efficiency even upon repeated use over a long period of time under severe environmental conditions of high temperature and high humidity. The present invention also include a process for producing said improved solar cell module.

2. Related Background Art

In recent years, heating of the earth because of the so-called greenhouse effect due to an increase of atmospheric $CO_2$ has been predicted. In view of this, there is an increased demand for a means of power generation capable of providing clean energy without causing $CO_2$ buildup. In this regard, nuclear power generation has been considered to be advantageous in view of not causing $CO_2$ buildup. However, there are problems for nuclear power generation in that it unavoidably produces radioactive wastes which are harmful for living things and there is a probability that leakage of injurious radioactive materials from the nuclear power generation system will happen when the system is damages. Therefore, there is an increased societal demand for early realization of a power generation system capable of providing clean energy without causing $CO_2$ buildup as in the case of thermal power generation and without causing radioactive wastes and radioactive materials as in the case of nuclear power generation.

There have been various proposals which are expected to meet such societal demand. Among those proposals, solar cells (i.e. photovoltaic elements) are expected to be a future power generation source since they supply electric power without causing those problems as above mentioned.

There have been proposed a variety of solar cells for commercial and home appliances. These solar cells include single crystal silicon solar cells, non-single crystal silicon solar cells, and compound semiconductor solar cells. And various studies have been made on these solar cells from various viewpoints such as reproducibility, productivity, production cost, and the like.

Among these solar cells, much attention has been focused on non-single crystal silicon solar cells since their semiconductor layer can be easily formed in a large area and in a desired form on a relatively inexpensive substrate and they therefore can be relatively easily produced and are of low production costs, although they do not provide a photoelectric conversion efficiency as high as that provided by the single crystal silicon solar cells.

Now, a solar cell module comprising a plurality of photovoltaic elements (or solar cell elements) integrated in series connection is usually used outdoors and because of this, it is required to have not only good weathering resistances in terms of resistance to rain (water), dust, ultraviolet rays, heat, humidity, and the like but also good impact resistance and good flexibility. In order to meet these requirement, there is often used a bendable electroconductive member made of e.g. stainless steel foil as the substrate therefor. A solar cell module provided with such an electroconductive substrate is advantageous in that it is satisfactory particularly in terms of impact resistance and it is relatively low not only in terms of weight per unit area but also in terms of weight per unit output power. Further, in order to attain a good strength for a solar cell module, the solar cell module is sometimes configured to be in a planar form in which its constituent photovoltaic elements are fixed to a backside reinforcing member.

In addition, in order to make a solar cell module suitable for use outdoors, it is required for the solar cell module to have satisfactory weathering resistances in terms of resistance to rain (water), dust, ultraviolet rays, heat, humidity, and the like by means of a protective member. The protective member in this case is desired to be relatively light weight in order that the solar cell module can be easily placed in various locations.

As such solar cell module, there has been proposed a solar cell module having a configuration in which an integrated body comprising a plurality of solar cell elements is arranged through a filler between a surface protective film and a back face protective film. For instance, there is known a solar cell module in which the incident side (that is, the side through which light is impinged) is covered by a stack comprising a protective film made of polyethylene tetrafluoroethylene (PETFE) and a filler stacked in this order from the surface side, and the back face (that is, the side opposite the incident side) is covered by a back face protective film through a filler, wherein the back face protective film has thereon a stack comprising a filler and a back face-reinforcing member stacked in this order from the back face protective film side. The back face protective film herein is insulative in order to ensure the substrate side of the solar cell module is insulated.

FIG. 9(A) is a schematic perspective plan view illustrating an example of a conventional solar cell module having such configuration as above described. FIG. 9(B) is a schematic cross-sectional view of an end portion (indicated by broken line Y-Y' in FIG. 9(B)) of the solar cell module shown in FIG. 9(A) before use. FIG. 9(C) is a schematic cross-sectional view of an end portion (indicated by broken line Y-Y' in FIG. 9(A)) of the solar cell module shown in FIG. 9(A) after use outdoors over a long period of time. In FIGS. 9(A) through 9(C), reference numeral 901 indicates a back face reinforcing member, reference numeral 902 a solar cell, each of reference numerals 903 and 903' a filler, reference numeral 904 a back face protective film, and reference numeral 905 a surface protective film.

In the conventional solar cell module configured as shown in FIGS. 9(A) and 9(B), there is usually used ethylene-vinyl acetate copolymer (EVA) or polyvinyl butyral as the filler (903, 903'). These materials are relatively high in moisture absorption and because of this, as the solar cell module is repeatedly used, moisture gradually enters through the end portions to arrive at the solar cell, resulting in short-circuiting of the solar cell through their pinholes or short-circuiting of the opposite terminals due to leakage thereby deteriorating the photoelectric conversion efficiency of the solar cell module. Besides this problems, another problem which often occurs for the conventional solar cell module is that when the solar cell module is subjected to irradiation of sunlight outdoors over a long period of time for the purpose of generating electric power, the filler gradually suffers from negative influences of ultraviolet rays, heat and the like and deteriorates in terms of its adhesion, thereby causing erosion such as shown in FIG. 9(C) wherein erosion is shown between the surface protective film 905 and the filler 903, between the back face protective film 904 and the filler 903, between the back face protective film 904 and the filler 903', and between the filler 903' and the back face reinforcing member 901. This situation is more or less the same in the case where a material having a water absorption which is relatively smaller than that of the aforesaid EVA or polyvinyl butyral is used as the filler.

In order to solve these problems in the prior art, Japanese Laid-open Patent Application No. 4-101465/1992 proposes a method of improving the moisture resistance of a solar cell module by sealing the end portions thereof with the use of resin comprising butyl rubber. However, the butyl rubber used is not sufficient in terms of adhesion upon repeated use outdoors over a long period of time. Thus, the solar call module disclosed in the Japanese document is still insufficient in terms of reliability upon repeated use over a long period of time.

Now, a solar cell module of the configuration shown in FIGS. 9(A) and 9(B) which is integrally provided with a back face reinforcing member is advantageous in that it can be easily bent so that it can be place on the roof of a building. FIG. 10(A) is a schematic perspective view of a bent solar cell module of the configuration shown in FIGS. 9(A) and 9(B) which is suitable for placing on the roof of a building. FIG. 10(B) is a schematic cross-sectional view of the bent portion of the solar cell module shown in FIG. 10(A). In FIGS. 10(A) and 10(B), reference numeral 1001 indicates a back face reinforcing member, reference numeral 1002 a solar cell, each or reference numerals 1003 and 1003' a filler, reference numeral 1004 a back face protective film, and reference numeral 1005 a surface protective film.

As for the solar cell module thus bent, there are problems in that crazings such as shown in FIG. 10(B) and/or pinholes (not shown in the figure) often occur at the surface protective layer 1005 upon bending the solar cell module, and these crazing and/or pinholes allow moisture to penetrate the inside of the solar cell module when used outdoors, resulting in deterioration of the photoelectric conversion efficiency. In order to prevent such defects from occurring, bending of a solar cell module of the foregoing configuration may be performed at an increased radius R. In fact, when the radius R is 20 mm or above, such crazings or pinholes can be substantially prevented from occurring. However, there is problem in this case in that in order to provide a large area solar cell module at a desired location, for instance, on a roof of a building, it is necessary to arrange a plurality of such bent solar cell modules, wherein a remarkably large non-power generation area unavoidably results,

SUMMARY OF THE INVENTION

The present invention is aimed at eliminating the foregoing problems in the conventional solar cell module.

Another object of the present invention is to provide a highly reliable solar cell module which is free of occurrence of such short-circuits due to the foregoing moisture penetration as found in the conventional solar cell module even upon repeated use under severe environmental conditions, and which continuously exhibits a desirable photoelectric conversion efficiency over a long period of time.

A further object of the present invention is to provide a highly reliable solar cell module which always prevents moisture from penetrating into the interior even when it is in a bent form, and continuously exhibits a desirable photoelectric conversion efficiency without being deteriorated even upon repeated use over a long period of time under severe environmental conditions.

A still further object of the present invention is to provide a highly reliable solar cell module which can always be maintained in a stable state outdoors without suffering from rain (water), dust, ultraviolet rays, heat, humidity, and the like, and continuously exhibits a desirable photoelectric conversion efficiency without being deteriorated even upon repeated use over a long period of time under severe environmental conditions.

BRIEF DESCRIPTION OF THE DRAWINGS

FIG. 19 shows a further graph of the experimental results with respect to interrelations between the thickness of a filler in a solar cell module in which a given portion of the surface protective layer is thermally welded with the corresponding portion of the back face protective layer and photoelectric conversion efficiency provided by said solar cell module.

FIG. 20 shows a graph of the experimental results with respect to interrelations of the distance between one end portion of a solar cell element and a thermally fused portion in a solar cell module and the adhesion of said thermally fused portion.

FIG. 21 shows a graph of the experimental results with respect to interrelations between the thickness of a filler present at a thermally fused portion in a solar cell module and initial photoelectric conversion efficiency.

DETAILED DESCRIPTION OF THE INVENTION

Figure 1:
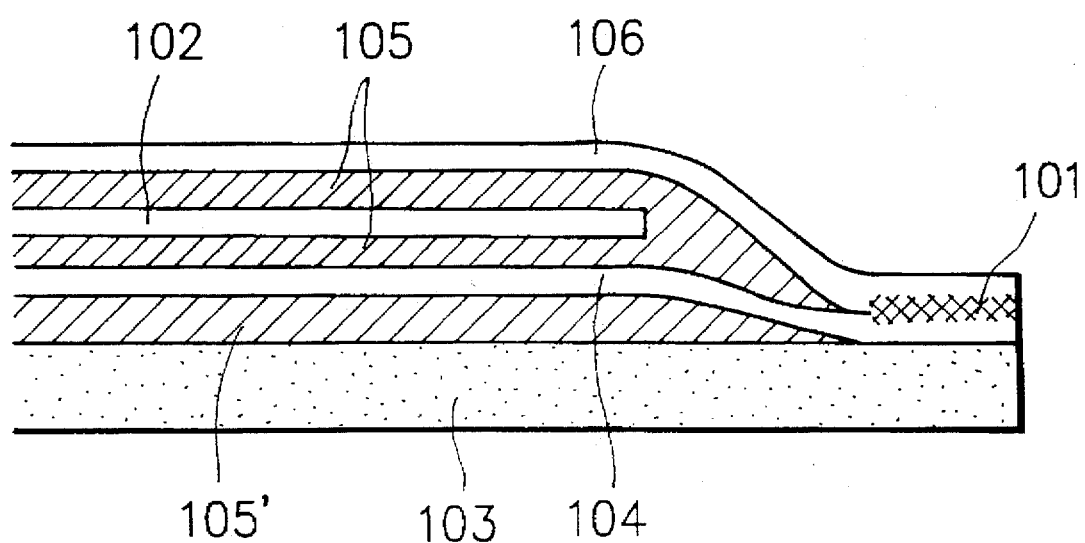
FIG. 1 is a schematic cross-sectional view of the principal part of an embodiment of a solar cell module according to the present invention.

In order to attain the above objects of the present invention, the present inventors made extensive studies through experiments and as a result, determined that for a conventional solar cell module which is insufficient in terms of reliability upon repeated use over a long period of time because it is accompanied by the foregoing problems caused mainly by moisture penetration, a desirable improvement can be attained not only in terms of the reliability but also in terms of the waterproofness when the surface protective layer is thermally welded directly with the back face protective layer so as to provide a heat-fused portion with a sufficient adhesion between the two layers.

A first embodiment of a solar cell module according to the present invention comprises a solar cell encapsulated through a filler between a surface protective layer and a back face protective layer, wherein said surface layer is heat face fusion welded with said back face protective layer to provide a heat-fused portion at at least a side end portion of said solar cell module.

A second embodiment of a solar cell module according to the present invention comprises a solar cell encapsulated through a filler between a surface protective layer and a back face protective layer, wherein a moisture preventive layer is disposed above said solar cell and under said surface protective layer, and said surface layer is heat fusion welded with said back face protective layer to provide a heat-fuse portion at at least a side end portion of said solar cell module.

A third embodiment of a solar cell module according to the present invention comprises a solar cell encapsulated through a filler between a surface protective layer and a back face protective layer disposed on a back face reinforcing member, wherein said surface layer is heat fusion welded with said back face protective layer to provide a heat-fused portion at at least a side end portion of said solar cell module.

A fourth embodiment of a solar cell module according to the present invention comprises a solar cell encapsulated through a filler between a surface protective layer and a back face protective layer disposed on a back face reinforcing member, wherein a moisture preventive layer is disposed above said solar cell and under said surface protective layer, and said surface layer is heat fusion welded with said back face protective layer to provide a heat-fused portion at at least a side end portion of said solar cell module.

A fifth embodiment of a solar cell module according to the present invention comprises a solar cell encapsulated through a filler between a surface protective layer and a back face protective layer, wherein said surface layer is heat fusion welded with said back face protective layer to provide a heat-fused portion at at least a side end portion of said solar cell module, and said solar cell module is provided with opposite bent portions.

A sixth embodiment of a solar cell module according to the present invention comprises a solar cell encapsulated through a filler between a surface protective layer and a back face protective layer, wherein a moisture preventive layer is disposed above said solar cell and under said surface protective layer, said surface layer is heat fusion welded with said back face protective layer to provide a heat-fused portion at at least a side end portion of said solar cell module, and said solar cell module is provided with opposite bent portions.

A seventh embodiment of a solar cell module according to the present invention comprises a solar cell encapsulated through a filler between a surface protective layer and a back face protective layer disposed on a back face reinforcing member, wherein said surface layer is heat fusion welded with said back face protective layer to provide a heat-fused portion at at least a side end portion of said solar cell module, and said solar cell module is provided with opposite bent portions.

And eighth embodiment of a solar cell module according to the present invention comprises a solar cell encapsulated through a filler between a surface protective layer and a back face protective layer disposed on a back face reinforcing member, wherein a moisture preventive layer is disposed above said solar cell and under said surface protective layer, said surface layer is heat fusion welded with said back face protective layer to provide a heat-fused portion at least a side end portion of said solar cell module, and said solar cell module is provided with opposite bent portions.

In any of the above-described embodiments, the solar cell may comprises a plurality of solar cell elements integrated in series connection.

In any of the above-described embodiments, it is preferred for the heat-fused portion to be provided at two or more side end portions of the solar cell module. In the most preferred embodiment, the heat-fused portion is provided at each of the four side end portions such that the solar cell is tightly encapsulated within the solar cell module.

In any case, the heat-fused portion is formed by subjecting the surface protective layer and back face protective layer together with the filler situated between the two layers to heat fusion treatment to thereby weld the two layers while melting out the filler. It is desired for the heat fusion treatment to be conducted by means of ultrasonic bonding.

As for the filler dedicated for the heat fusion treatment, it is desired to be of a thickness corresponding to a value in terms of μm obtained on the basis of the equation: (the thickness (μm) of the solar cell)+75 μm to 1400 μm.

As for the heat-fused portion, it is desired to be situated at a position which is at a distance in terms of μm obtained on the basis of the equation: (the thickness of the filler between the surface protective layer and back face protective layer which is dedicated for the heat fusion treatment) ×0.8, from the corresponding end portion of the solar cell.

The heat-fusion portion desirably exhibits an adhesion of 10 Kgf/25 mm (width) in a 180° peel test in which the adhesion is determined by cutting a given portion of the heat-fused portion comprising the surface protective layer and back face protective layer welded to each other to obtain a test sample having a width of 25 mm, and pulling the surface protective layer and back face protective layer relative to each other in opposite directions at 180° under environmental conditions of 85° C. and 85% RH.

In any of the above-described embodiments, the surface protective layer desirably comprises a film made of a fluorine-containing resin such as polyethylenetetrafluoroethylene, polyethylenetrifluoride, and polyvinyl fluoride. The back face protective layer desirably comprises a film made of nylon or polyethylene terephthalate. The filler desirably comprises a material having a light-transmitting property, thermoplasticity, and weatherability. Specific examples of such material are vinyl acetate-ethylene copolymer, butyral resin, silicone, resin, epoxy resin, and fluorinated polyimide resin.

The moisture preventive layer desirably comprises a film formed of a paint comprising acrylic resin and silicon polymer, an inorganic oxide-type paint, or silicon dioxide.

The back face reinforcing member desirably comprises a member excelling in weatherability, rigidity, flexibility, and thermal conductivity. In a most preferred embodiment, the back face reinforcing member is constituted by a member which is of 30 W/m.K.s., with m being a minute, K being 1° C. and s being a second, in coefficient of thermal conductivity. Such member can include a metal sheet and a zinc-coated steel sheet.

Detailed description will now be made of the solar cell modules with reference to the drawings.

FIG. 1 is a schematic cross-sectional view of the principal part of an embodiment of a solar cell module according to the present invention.

In FIG. 1, reference numeral 102 indicates a photovoltaic element (or a solar cell element) encapsulated through a filler 105 between a back face protective layer (or a back face protective film) 104, which is disposed through a filler 105' on a back face reinforcing member 103, and a surface protective layer (or a surface protective film) 106, wherein an end portion of the surface protective layer 106 is directly heat-fused with the corresponding end portion of the back face protective layer 104 in such a state as shown by reference numeral 101 in the figure. In FIG. 1, there is shown only one heat-fused portion. However, in practice the solar cell module is provided with such heat-fused portion at at least opposite end portions thereof. In a most preferred embodiment, the solar cell module is provided with such heat-fused portion at each of the four end portions thereof so that the solar cell disposed therein is tightly sealed.

The solar cell module according to the present invention may be provided with a moisture preventive layer. The moisture preventive layer further provides the solar cell module with waterproofness so that the solar cell disposed in the solar cell module does not suffer from moisture invasion even in the case where the surface protective layer has defects such as cracks, pinholes or the like.

Figure 4A:
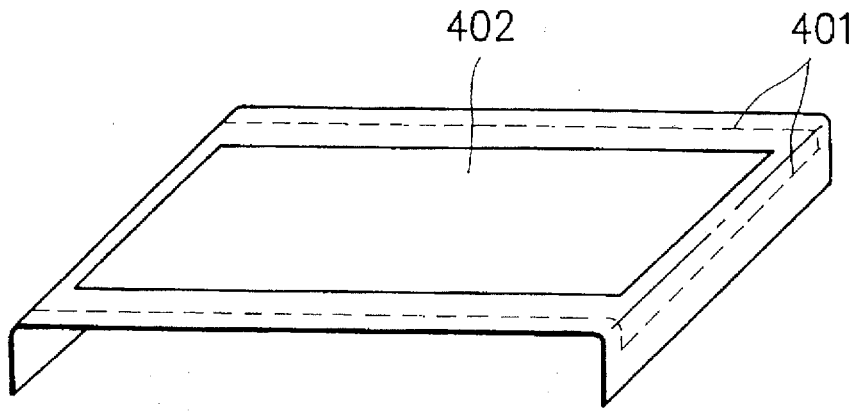
FIG. 4(A) is a schematic perspective view illustrating a solar cell module obtained in Example 9 of the present invention which will be later described, in which a given portion of the surface protective film is thermally welded with the corresponding portion of the back face protective film.
Figure 4B:
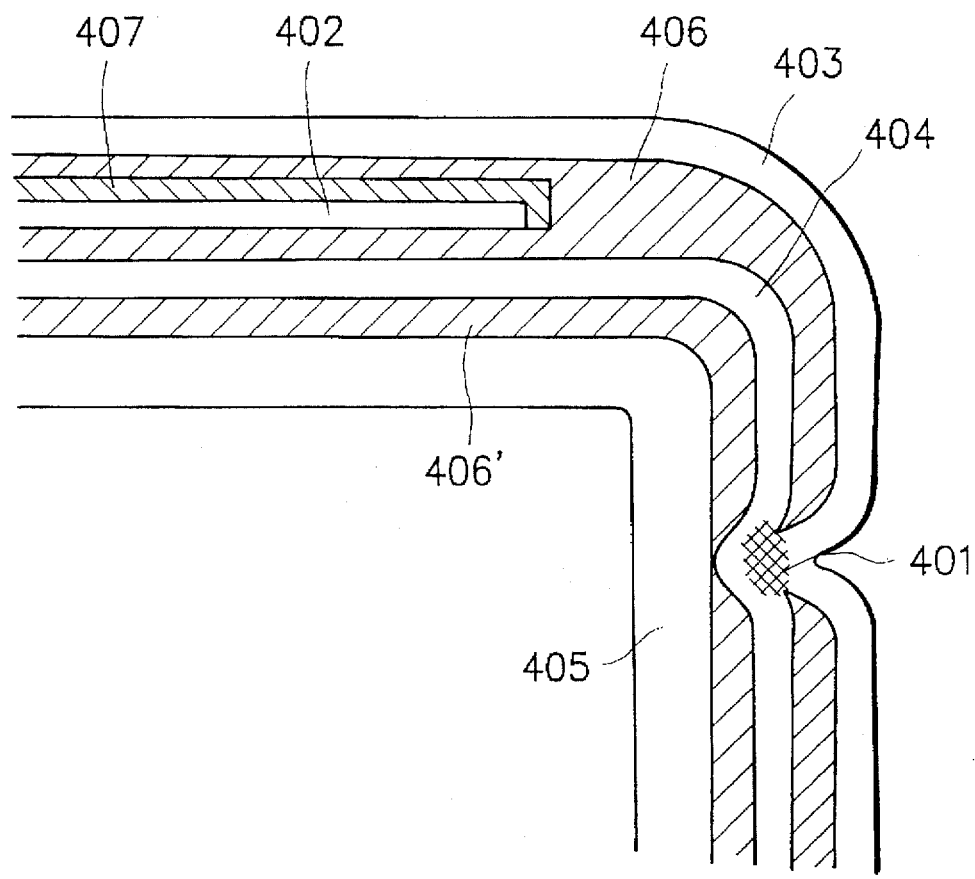
FIG. 4(B) is a schematic cross-sectional view of the principal part of the solar cell module shown in FIG. 4(A).

Such moisture preventive layer may be disposed at a desired position in the solar cell module. Specifically, the moisture preventive layer may be disposed so as to encircle the solar cell except for the back face protective layer side, for instance, as shown in FIG. 2(B) and FIG. 4(B) in which the moisture preventive layer (207 in FIG. 2(B) and 407 in FIG. 4(B)) is disposed so as to encircle the solar cell (202 in FIG. 2(b) and 402 in FIG. 4(b)) except for the back face protective layer side. Incidentally, the solar cell module shown in FIGS. 2(A) and 2(B) and the solar cell module shown in FIGS. 4(A) and 4(B) are of the same configuration as the solar cell shown in FIG. 1, except that they have a moisture preventive layer (207 or 407) and opposite bent portions containing no solar cell. Detailed description of each of the solar cell modules shown in FIGS. 4(A) and 4(B) will be made later.

Figure 12:
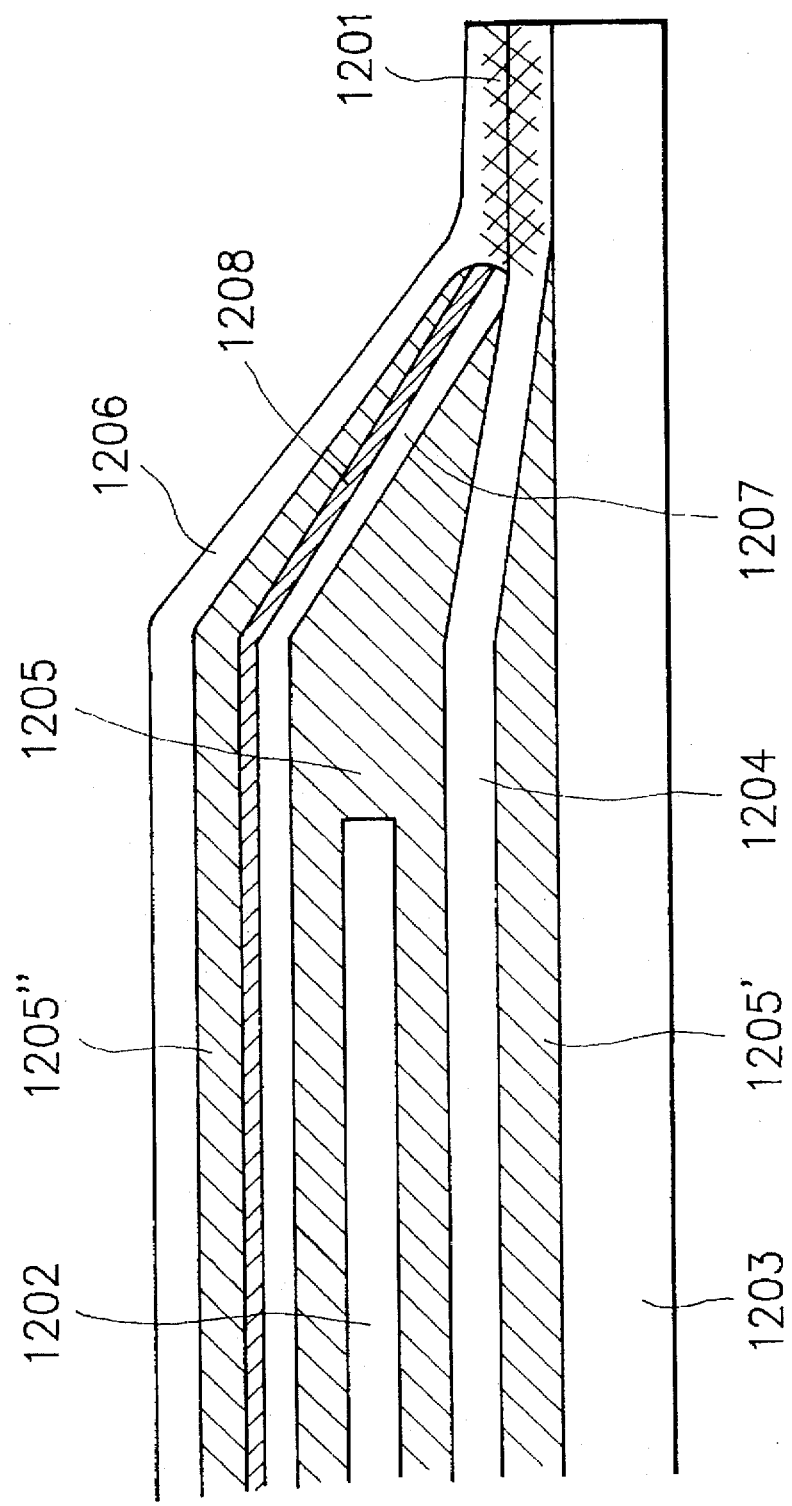
FIG. 12 is a schematic cross-sectional view of a solar cell module provided with a moisture preventive layer composed of silicon dioxide according to the present invention.

Alternatively, the moisture preventive layer may be disposed above the filler situated above the solar cell on the surface protective layer side, for instance, as shown in FIG. 12. The solar cell module shown in FIG. 12 is a partial modification of the solar cell module shown in FIG. 1.

In FIG. 12, reference numeral 1202 indicates a solar cell encapsulated through a filler 1205 between a back face protective layer (or a back face protective film) 1204, which is disposed through a filler 1205' on a back face reinforcing member 1203, and a transparent layer (or a transparent film) 1207 on which a moisture preventive layer 1208, a filler 1205", and a surface protective layer 1206 are disposed in this order from the solar cell side, wherein an end portion of the surface protective layer 1206 is heat fusion welded with the corresponding end portion of the back face protective layer 1204 in such a state as shown by reference numeral 1201 in the figure (the portion indicated by reference numeral 1201 in the figure will be hereinafter referred to as "heat-fused portion").

In the solar cell module shown in FIG. 12, the composite comprising the transparent layer 1207 and the moisture preventive layer 1208 is not extended into the heat-fused portion 1201.

In the following, description will be made of each of the constituents of the solar cell module according to the present invention.

Solar Cell

Figure 11:
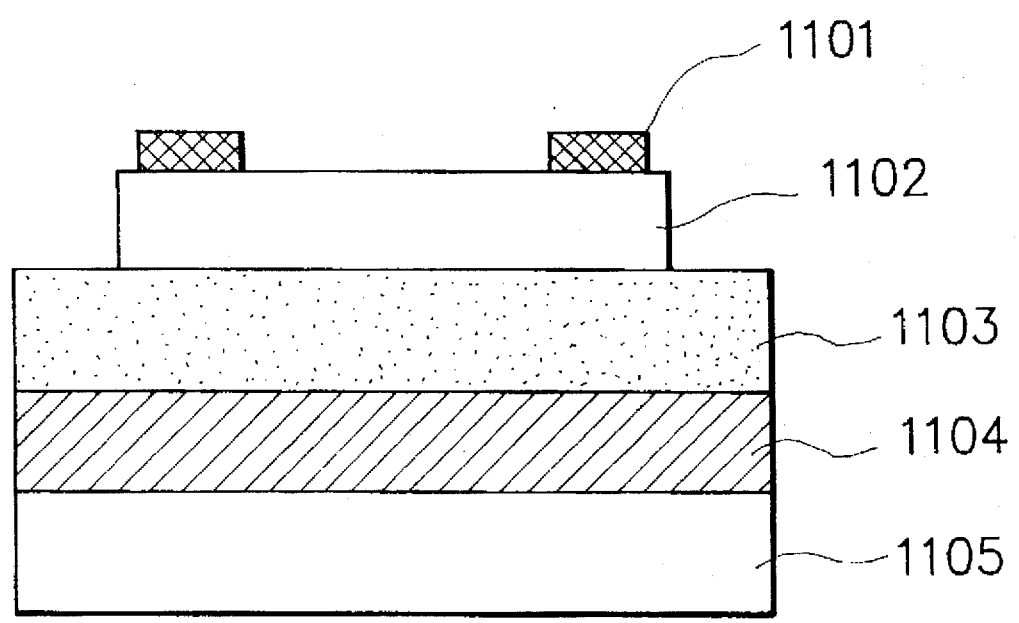
FIG. 11 is a schematic cross-sectional view of the constitution of a solar cell element used in a solar cell module according to the present invention.

As the solar cell, there can be used any conventional solar cell comprising one or more solar cell elements having a photoelectric conversion layer. FIG. 11 illustrates an example of such solar cell element. The solar cell element shown in FIG. 11 comprises an electroconductive substrate 1105, a back reflecting layer (or a so-called back reflector) 1104 disposed on the electroconductive substrate 1105, a semiconductor layer 1103 as a photoelectric conversion layer disposed on the back reflecting layer 1104, a transparent and conductive layer 1102 disposed on the semiconductor layer 1103, and a collecting electrode (or a grid electrode) 1101 disposed on the transparent and conductive layer 1102. It is possible for the back reflecting layer 1104 to be designed such it also serves as an electroconductive substrate. In this case, the electroconductive substrate 1105 can be omitted.

As for the electroconductive substrate 1105, there is no particular restriction as long as it has an electroconductive surface. Specifically, it may be an electroconductive member composed of a metal such as Al, Cu, or the like, an electroconductive member composed of an alloy such as stainless steel, or the like, or an electroconductive member of another type of electroconductive material such as carbon, or the like. As an alternative, the substrate 1105 may be a film or sheet made of a synthetic resin such as polyamide, polyester, polyethylenenapthalide, or epoxy resin or a sheet made of a ceramic. In this case, the substrate is deposited with a metallic member comprising, for example, galvanized sheet iron or an electroconductive member on the surface thereof.

The semiconductor layer 1103 may be composed of a single crystal silicon semiconductor material, a non-single crystal silicon semiconductor material (specifically, for example, an amorphous silicon semiconductor material or a polycrystalline silicon semiconductor material), or a compound semiconductor material (specifically, for example, copper-indium-selenide).

In any case, the semiconductor layer comprised of any of the above semiconductor materials may be of a stacked structure with a pin junction, a pn junction or a Schottky type junction.

The semiconductor layer comprised of any of the above semiconductor materials may be formed by a conventional film-forming technique. For instance, the non-single crystal silicon semiconductor layer may be formed by a conventional plasma CVD technique using silane gas. Particularly, in the case where the semiconductor layer is constituted by a polycrystalline silicon semiconductor material, it may be formed by a conventional polycrystalline silicon film-forming manner of providing a fused silicon material and subjecting the fused silicon material to film-deposition processing, or another conventional polycrystalline silicon film-forming method of subjecting an amorphous silicon material to heat treatment.

In the case where the semiconductor layer is constituted by a compound semiconductor material, e.g., CuInSe$_2$/CdS, it may be formed by a conventional electron beam evaporation or sputtering, or an electrolytic technique in which a semiconductive layer is formed by way of electrolysis of a desired electrolyte.

In a preferred embodiment, the semiconductor layer 1103 is disposed such that it is interposed between the back reflecting layer 1104 and the transparent and conductive layer 1102.

The back reflecting layer 1104 may comprise a metal layer, a transparent and conductive layer composed of, for example, a metal oxide, or a two-layered structure comprising said metal layer and said transparent and conductive layer. The metal layer may be comprised of Ti, Cr, Mo, W, Al, Ag, or Ni. The transparent and conductive layer may be comprised of ZnO$_2$, TiO$_2$, SnO$_2$, or ITO (In$_2$O$_3$–SnO$_2$). In any case, it is desired for the back reflecting layer to have a roughened surface in order that the incident light is effectively utilized.

The back reflecting layer 1104 may be formed by a conventional resistance heating evaporation, electron beam evaporation, or sputtering.

The transparent and conductive layer 1102 may be formed of In$_2$O$_3$, SnO$_2$, ITO (In$_2$O$_3$–SnO$_2$), ZnO, TiO$_2$, or Cd$_2$SnO$_4$. In an alternative, the transparent and conductive layer 1102 may comprise a crystalline semiconductor layer doped with a desired impurity in a high concentration.

The transparent and conductive layer constituted by any of the above materials may be formed by a conventional resistance heating evaporation, electron beam evaporation, sputtering; spraying, or CVD. The above impurity-doped crystalline semiconductor layer as the transparent and conductive layer may be formed by way of a conventional impurity-diffusion film-forming method.

The collecting electrode (or the grid electrode) 1101 serves to effectively collect the electric current generated at the transparent and conductive layer. The collecting electrode may be formed of a metal material comprising powdered Ti, Cr, Mo, W, Al, Ag, Ni, Cu, Sn, or an alloy of these metals dispersed in a binder resin such as phenol resin, urethane resin, rubber, polyester, epoxy resin, acrylic resin, alkyd resin, or polyvinyl acetate. The collecting electrode may be formed by providing a metal paste comprising powder of one of the above-mentioned metal materials dispersed in one of the above-mentioned binder resins and subjecting the metal paste to screen printing.

Alternately, the collecting electrode may be formed by a conventional sputtering, resistance heating evaporation, CVD, or photo-induced CVD with the use of a patterning mask. Besides this, the collecting electrode may be formed by depositing a metal layer over the entire surface and subjecting the metal layer to etching treatment to form a desired pattern as the collecting electrode or by forming a negative pattern corresponding to the pattern of the collecting electrode and subjecting the resultant to plating treatment.

On the collecting electrode, there is often disposed a so-called bus bar (not shown in the figure) capable of collecting and transporting the electric current collected by the collecting electrode, and which is made of tin or nickel or solder-coated copper. The bus bar is electrically connected to the collecting electrode by a conventional manner using an electroconductive adhesive or solder.

Surface Protective Layer

The surface protective layer is required to be constituted by an appropriate material which is satisfactory in terms of light-transmitting property and weatherability and which does not attract foreign matter. In order to meet these requirements, the surface protective layer comprises a film made of a fluorine-contained resin such as polyethylenetetrafluoroethylene (ETFE), polyethylenetrifluoride, or polyvinyl fluoride.

Upon disposing the above resin film as the surface protective layer on the filler, the face of the resin film which is to be contacted with the filler may be subjected to preliminary treatment, for instance, by way of corona discharge in advance, whereby adhesion of the resin film with the filler is ensured.

Filler

The filler is required to comprise a material which is satisfactory in terms of light-transmitting property, thermoplasticity, and weatherability. Specific examples of such material suitable as the filler are transparent resins such as vinyl acetate-ethylene copolymer (EVA), butyryl resin, silicone resin, epoxy resin, and fluorinated polyamide resin.

The filler may be a composition comprising any of the above-mentioned resins and an appropriate cross-linking agent, having a crosslinked structure.

In order to prevent the filler from suffering from light-induced fatigue, it is desired for the filler to contain an UV absorber.

Back Face Protective Layer

The back face protective layer (or the back face protective film) is used for the purpose of electrically isolating the solar cell from external materials including the back face reinforcing member. In general, the solar cell is electrically isolated since it is encapsulated by the filler which is electrically insulative. However, the filler usually varies in terms of thickness and because of this, there is a fear that the solar cell will be short-circuited with an external material or the back face reinforcing member. The back face protective layer is disposed in order to prevent occurrence of this problem.

The back face protective layer is comprised of a film of nylon or polyethylene terephthalate (PET).

In an alternative, the back face protective layer may comprise a stacked body comprising a film of any of said resins applied on a member as the back face reinforcing member 103.

Back Face Reinforcing Member

The back face reinforcing member is not always necessary. However, not only in order to reinforce the physical strength of the solar cell module but also in order to prevent a thermal energy generated upon heat-fusing the surface protective layer with the back face protective layer from affecting the solar cell, it is desirable to provide the solar cell module with the back face reinforcing member.

The back face reinforcing member must be good in terms of weatherability, rigidity, flexibility and thermal conductivity. Particularly, it is important for the back face reinforcing member to be good in terms of thermal conductivity. Specifically, the back face reinforcing member is desired to be 30 w/m.K.s or more, with m being a minute, K being 1° C. and s being a second, in the coefficient of thermal conductivity at 300° C. in order to effectively prevent thermal energy generated upon heat-fusing the surface protective layer with the back face protective layer from affecting the solar cell.

The back face reinforcing member is usually comprised of a metal sheet or a zinc-coated steel sheet.

Moisture Preventive Layer

The moisture preventive layer is desirably of a moisture permeability of 10–150 g/m$^2$/day when its thickness is 100 μm. Specifically, the moisture preventive layer desirably comprises a film formed of a paint comprising a composite of an acrylic resin and an inorganic polymer (specifically, silicone polymer such as siloxane), and inorganic oxide-containing paint, or a silicon dioxide material (specifically, a silicon dioxide deposited film).

In the case of the solar cell module shown in FIG. 12, the moisture preventive layer 1208 is comprised of a silicon dioxide film in a preferred embodiment. The silicon dioxide film is not melted at a temperature at which the surface protective layer and the back face protective layer are subjected to heat fusion and because of this, it is impossible for the silicon dioxide film to be welded together with these two layers by way of heat fusion. Hence, it is necessary for the silicon dioxide film as the moisture preventive layer to be terminated before the region where the surface protective layer and the back face protective layer are welded by way of heat fusion.

The silicon dioxide film as the moisture preventive layer 1208 is formed by depositing a silicon dioxide film on a transparent film composed of, for example, polyethylene terephthalate (PET) as the transparent layer 1207 by means of a vacuum evaporation technique. The composite thus obtained is laminated on the surface of the filler 1205 enclosing the solar cell 1202.

Layer Welding (in order to provide a heat-fused portion)

The surface protective layer is welded with the back face protecting layer by way of heat fusion such that the solar cell is encapsulated through the filler between the surface protective layer and the back face protective layer.

In the following, description will be made of the heat-fused portion of the solar cell module with reference to the drawings.

Figure 13:
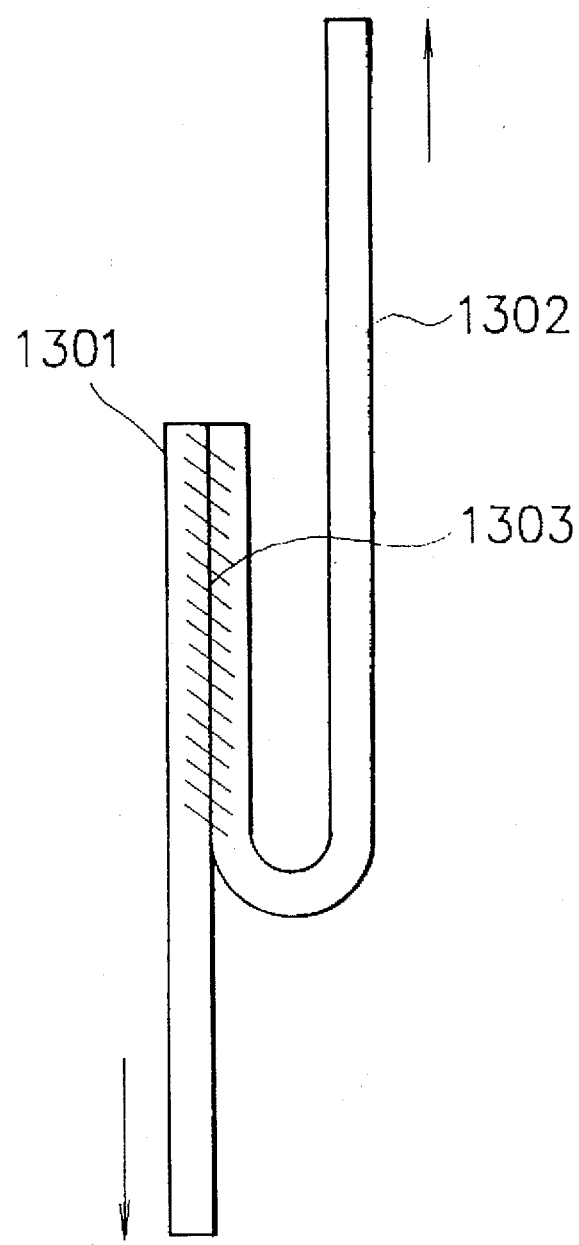
FIG. 13 is a schematic explanatory view of the 180° peel test employed for examining whether or not a desirable heat-fused portion is formed.

Firstly, it is desired that the surface protective layer is welded with the back face protective layer by way of heat-fusion so as to provide an adhesion of 10 Kgf/25 mm (width) or more for the welded portion (or the heat-fused portion). The adhesion can be determined by the conventional 180° peel test shown in FIG. 13. In FIG. 13, there is shown a test sample obtained by cutting a part of the heat-fused portion, said test sample comprising a surface protective layer 1303 of 100 μm in thickness and 25 mm in width through a heat-fused portion 1303. In the peel test, the two layers welded as shown in FIG. 13 are pulled relative to each other in opposite directions indicated by the arrow as shown in FIG. 13 at a pulling speed of 50 mm/minute under environmental conditions of 85° C. and 85% Rh, to thereby determine the adhesion of the heat-fused portion 1302 in terms of Kgf/width.

As for the position where the surface protective layer is welded with the back face protective layer by way of heat-fusion, it is necessary that it be separated by a desired distance from the corresponding end portion of the solar cell.

In the following, description will be made of this requirement.

Figure 16:
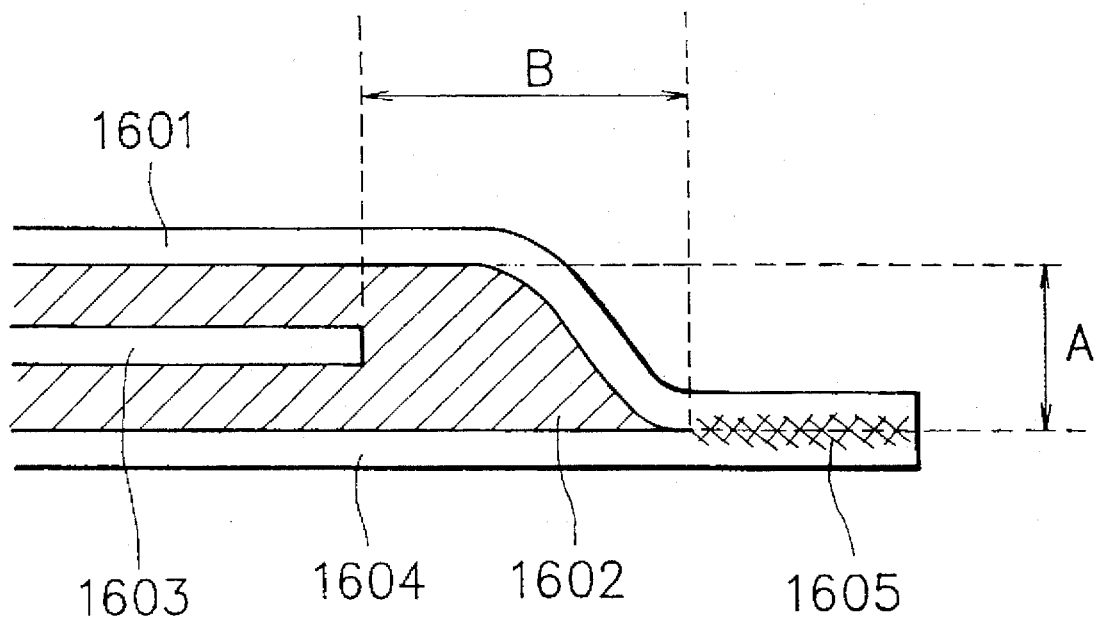
FIG. 16 is a schematic view for explaining the distance between one end portion of a solar cell and the corresponding end portion of a heat-fused portion in a solar cell module according to the present invention.

FIG. 16 is a schematic cross-sectional view of the principal part of a solar cell module comprising a solar cell 1603 encapsulated through a filler 1602 between a surface protective layer 1601 and a back face protective layer 1604, wherein the surface protective layer 1601 is heat-fusion welded with the back face protective layer 1604 to provide a heat-fused portion 1605. In FIG. 16, A indicates the thickness of the filler 1602 situated between a given portion of the surface protective layer and a given portion of the back face protective layer which are dedicated for heat-fusion welding of the two layers, and B indicates the distance between the end of the solar cell 1603 and the front end of the heat-fused portion 1605.

In the case where the distance B is excessively small, the heat-fused portion cannot be established in a desirable state because the end portion of the solar cell is negatively influenced. In order to establish the heat-fused portion in a desirable state, it is necessary for the distance B to be relatively large so that no negative influence is caused by the establishment of the heat-fused portion.

As apparent from FIG. 16, the filler situated between a given portion of the surface protective layer and given portion of the back face protective layer which are dedicated for heat-fusion welding of the two layers is melted and flows out because the filler is comprised of a material having a melting point which is lower than that of the constituent material of each of the surface protective layers and the back face protective layer.

FIG. 20 is a graph of the experimental results with respect to the interrelation between the distance B and the adhesion of the heat-fused portion, which were obtained through experiments by the present inventors.

Particularly, a plurality of solar cell module samples of the configuration shown in FIG. 16 were prepared, each being different in terms of the distance B in the range of 300 µm to 500 µm, and each of the resultant solar cell module samples was subjected to the foregoing peel test shown in FIG. 13. The results obtained are graphically shown in FIG. 20.

Each solar module sample was prepared in the following manner. That is, a 500 µm thick nylon film (trademark name: DARTEK, produced by De Pont Company) as the back face protective layer 1604, a 500 µm thick ethylene-vinyl acetate copolymer (EVA) member (A-9918 Formulation, produced by Mobay Company) as the filler 1602, a solar cell 1603 of the configuration shown in FIG. 11, a 500 µm thick ethylene-vinyl acetate copolymer (EVA) member (A-9918 Formulation, produced by Mobay Company) as the filler 1602, and a 50 µm thick ethylenetetrafluoroethylene film (trademark name: AFLEX (non-extended), produced by Asahi Glass Co., Ltd.) as the surface protective layer 1601 were stacked in this order to obtain a stacked body. The stacked body was placed in a vacuum vessel, wherein it was subjected to heat treatment at 150° C. for 30 minutes while evacuating the inside of the vacuum vessel to a predetermined vacuum degree, followed by cooling to room temperature. The resultant was then subjected to ultrasonic bonding, wherein an end portion thereof was heat-fused so as to weld the surface protective layer with the back face protective layer, whereby a heat-fused portion 1605 was formed so as to have a different distance B of 300 to 500 µm between the end of the solar cell 1603 and the front end of the heat-fused portion 1605.

Each of the solar cell module samples thus obtained was subjected to the foregoing 180° peel test at a pulling speed of 50 mm/minute under environmental conditions of 85° C. and 85% Rh in the manner described above with reference to FIG. 13, to thereby measure the adhesion of the heat-fused portion. The results obtained are graphically shown in FIG. 20 as a function of the distance B.

Based on the results shown in FIG. 20, the following findings were obtained. That is, (i) in the case where the distance B is 400 mm or more, there is provided a satisfactory heat-fused portion (that is, the surface protective layer is heat fusion welded with the back face protective layer in a desirable state), and (ii) since the thickness A is 1000 µm (that is, the two 500 µm thick filler members given thickness A of 1000 µm), a satisfactory heat-fused portion is provided when the distance B is equivalent to or above a value obtained by the equation: A×0.8, with A being the thickness of the filler dedicated for heat fusion.

In the present invention, the foregoing thickness A of the filler dedicated for heat fusion is an important factor in order to establish a desirable heat-fused portion in a solar cell module so that the solar cell module stably and continuously exhibits a photoelectric conversion efficiency as desired.

In the following, a description will be given of this situation.

Figure 14A:
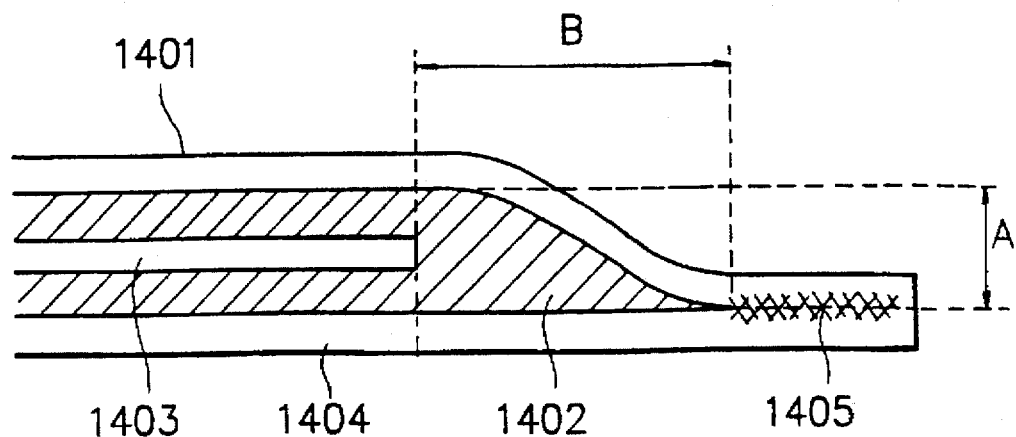
FIG. 14(A) is a schematic view for explaining the thickness of a filler selected for heat fusion in a solar cell module.
Figure 14B:
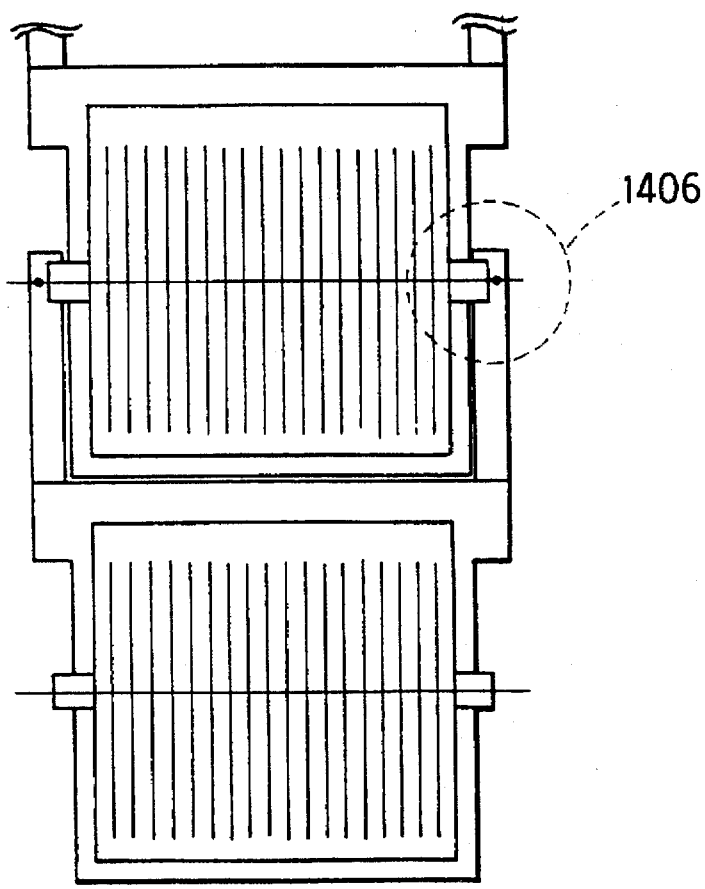
FIG. 14(B) is a schematic view for explaining an integration in series connection of a plurality of solar cell elements in the solar cell module shown in FIG. 14(A).

FIG. 14(A) is a schematic cross-sectional view of the principal part of a solar cell module comprising a solar cell comprising a plurality of solar cell elements integrated in series connection as shown in FIG. 14(B) encapsulated through a filler 1402 between a surface protective layer 1401 and a back face protective layer 1404, wherein the surface protective layer 1401 is heat-fusion welded with the back face protective layer 1404 to provide a heat-fused portion 1405. In FIG. 14(A), there is shown only one heat-fused portion. However, each of the four side portions of the solar cell module is tightly sealed by way of such heat-fused portion as indicated by reference numeral 1405 in FIG. 14(A). In FIG. 14(A), A indicates the thickness of the filler 1402 situated between a given portion of the surface protective layer and a given portion of the back face protective layer which are dedicated for heat-fusion welding of the two layers, and B indicates the distance between the end of the solar cell 1403 and the front end of the heat-fused portion 1405. FIG. 14(B) is a schematic plan view of the solar cell 1403 shown in FIG. 14(A) when viewed from the side through which light is impinged, wherein as above described, the solar cell 1403 comprises a plurality of solar cell elements integrated in series connection through respective electric wirings 1406. From FIG. 14(B), it is understood that each of the electric wirings 1406 is positioned at an end portion of the corresponding solar cell element.

Now, as for the thickness A of the filler 1402 situated between the surface protective layer 1401 and the back face protective layer 1404, when it is relatively thin, although the heat fusion welding between the surface protective layer and the back face protective layer can be easily carried out, a drawback entails in that a certain clearance is unavoidably caused at the solar cell embedded in the filler between the two layers to result in readily causing a removal of the filler between the two layers and because of this, the solar cell cannot be tightly encapsulated between the two layers. On the other hand, when the thickness A is relatively thick, although there can be established a heat-fused portion between the surface protective layer and the back face protective layer so that the solar cell is tightly encapsulated between the two layers, a drawback unavoidably entails in that a very large amount of thermal energy is necessary to be applied to the two layers in order to weld the two layers in a desirable state, wherein each of the two layers is caused by the excessive thermal energy to readily thermally decompose, resulting in making each of the two layers poor in texture such that cracking readily occurs, thereby allowing moisture therethrough into the filler when a certain stress is applied thereto. Thus, there is a certain limit for the thickness A.

In order to find a desirable range for the thickness A of the filler dedicated for heat fusion, the present inventors observed the interrelation between the thickness A of the filler in a solar cell module and the photoelectric conversion efficiency of the solar cell module.

Figure 17:
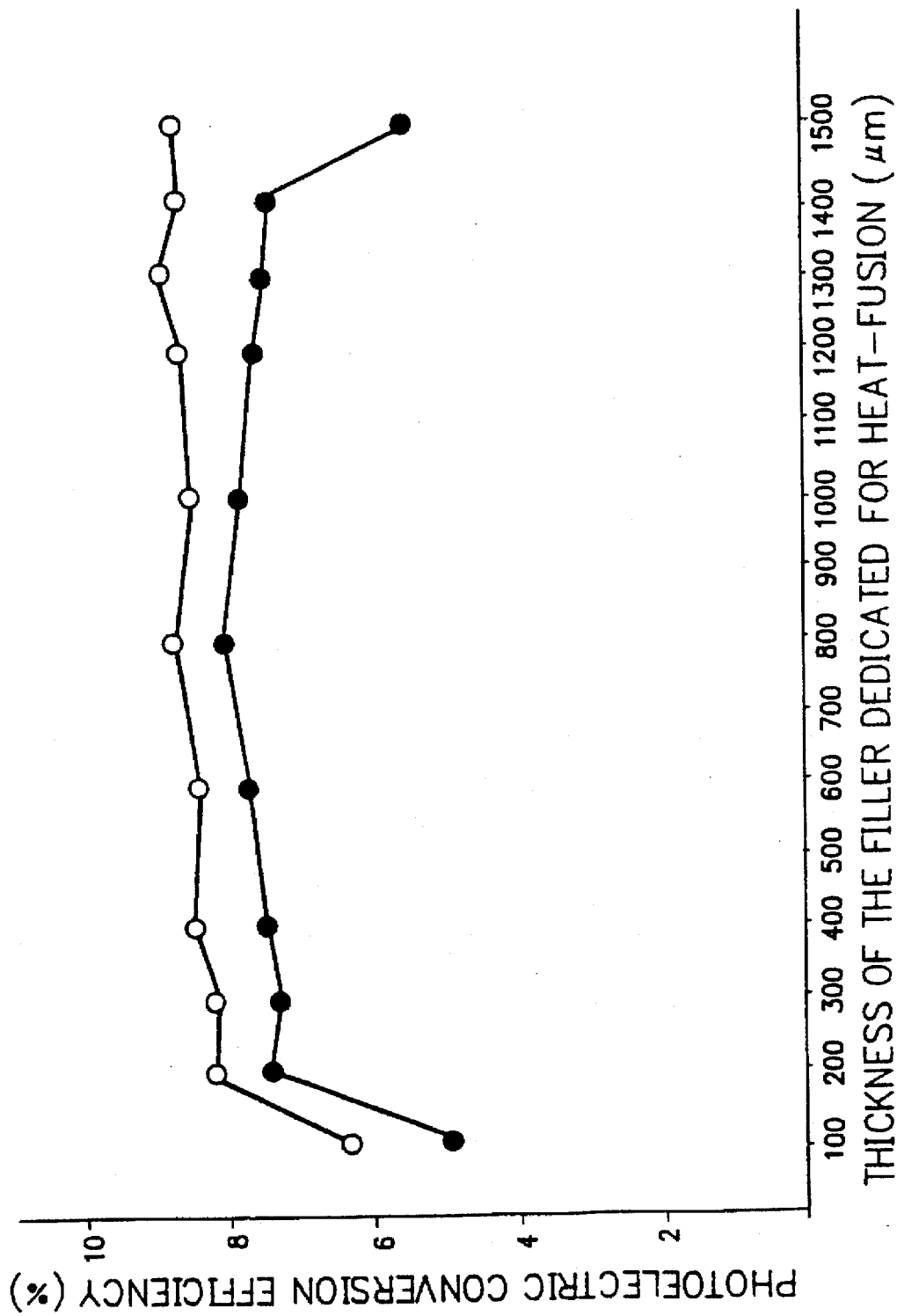
FIG. 17 shows a graph of the experimental results with respect to interrelations between the thickness of a filler in a solar cell module in which a given portion of the surface protective layer is thermally welded with the corresponding portion of the back face protective layer and photoelectric conversion efficiency provided by said solar cell module.

FIG. 17 is a graph of the results obtained as a result of having observed a plurality of solar cell modules, each having a different thickness A in the range of 100 to 1500 μm and containing a solar cell of 125 μm in thickness, with respect to interrelations between the thickness A of the filler dedicated for heat fusion and the photoelectric conversion efficiency exhibited by the solar cell module.

Particularly, a plurality of solar cell module samples of the configuration shown in FIGS. 14(A) and 14(B), each having a different thickness A in the range of 100 μm to 1500 μm, were prepared, and each of the resultant solar cell module samples was subjected to measurement of its initial photoelectric conversion efficiency and its photoelectric conversion efficiency after having been exposed to sunlight outdoors for 3 months by means of a commercially available solar cell simulator (trademark name: SPI-SUN SIMULATOR 240A (AM 1.5), produced by SPIRE Company). The measured results obtained are graphically shown in FIG. 17.

Each solar module sample was prepared in the following manner. That is, a 50 μm thick nylon film (trademark name: DARTEK, produced by Du Pont Company) as the back face protective layer 1404, an ethylene-vinyl acetate copolymer (EVA) member (A-9918 Formulation, produced by Mobay Company) having a different thickness in the range of 50 to 750 μm as the filler 1402, a solar cell 1403 of 125 μm in thickness comprising a plurality of solar cell elements, each having the configuration shown in FIG. 11, integrated in series connection as shown in FIG. 14(B), an ethylene-vinyl acetate copolymer (EVA) member (A-9918 Formulation, produced by Mobay Company) having a different thickness in the range of 50 to 750 μm as the filler 1402, and 50 μm thick ethylenetetrafluoroethylene film (trademark name: AFLEX (non-extended), produced by Asahi Glass Co., Ltd.) as the surface protective layer 1401 were stacked in this order to obtain a stacked body. The stacked body was placed in a vacuum vessel, wherein it was subjected to heat treatment at 150° C. for 30 minutes while evacuating the inside of the vacuum vessel to a predetermined vacuum degree, followed by cooling to room temperature. The resultant was then subjected to ultrasonic bonding, wherein each of the four side end portions thereof was heat-fused so as to weld the surface protective layer with the back face protective layer whereby four heat-fused portions 1405 were formed. As for the distance B between each of the opposite end portions of the solar cell 1403 and the front end portion of the corresponding heat-fused portion 1405, it was made constant at 1.2 mm in each solar cell module sample.

Each of the resultant solar cell module samples thus obtained was subjected to measurement of its initial photoelectric conversion efficiency and its photoelectric conversion efficiency after having been exposed to sunlight outdoors for 3 months by means of the foregoing solar cell simulator. The results obtained are graphically shown in FIG. 17 in relation to the thickness A.

Based on the results shown in FIG. 17, the following was obtained. That is, the solar cell module samples in which the thickness A is in the range of 200 to 1400 μm are satisfactory not only in initial photoelectric conversion efficiency (open circles 603 in FIG. 17) but also in photoelectric conversion efficiency after having been exposed to sunlight for 3 months (solid circles ● in FIG. 17) (this latter photoelectric conversion efficiency will be hereinafter referred to as photoelectric conversion efficiency after endurance).

However, it is understood that in the case where the thickness A is smaller than 200 μm, the solar cell module is apparently inferior in terms of both initial photoelectric conversion efficiency and photoelectric conversion efficiency after exposure. As for the reason for this, it is considered that since the thickness A was relatively small, the solar cell suffered from a negative influence of the thermal energy caused upon forming the heat-fused portion through the remaining filler.

It is also understood that in the case where the thickness A is beyond 1400 μm, the solar cell module is apparently inferior in terms of photoelectric conversion efficiency after exposure. The reason for this is considered as follows. That is, since the thickness A was relatively large, a large amount thermal energy had to be applied in order to form the heat-fused portion in a desirable state and because of this, each of the surface protective layer and the back face protective layer was affected by an excessive amount of thermal energy whereby each of the two layers was somewhat decomposed. Hence, although the solar cell module exhibited a satisfactory photoelectric conversion efficiency at the initial stage, it became poor in photoelectric conversion efficiency after having been exposed to sunlight for 3 months.

In the following, description will be made of the situation for a solar cell disposed in a solar cell module as above described which was adversely affected by thermal energy upon forming the foregoing heat-fused portion.

It is common knowledge that the filler disposed in a solar cell module should have a sufficient thickness to enclose a solar cell disposed in the solar cell module.

Figure 15:
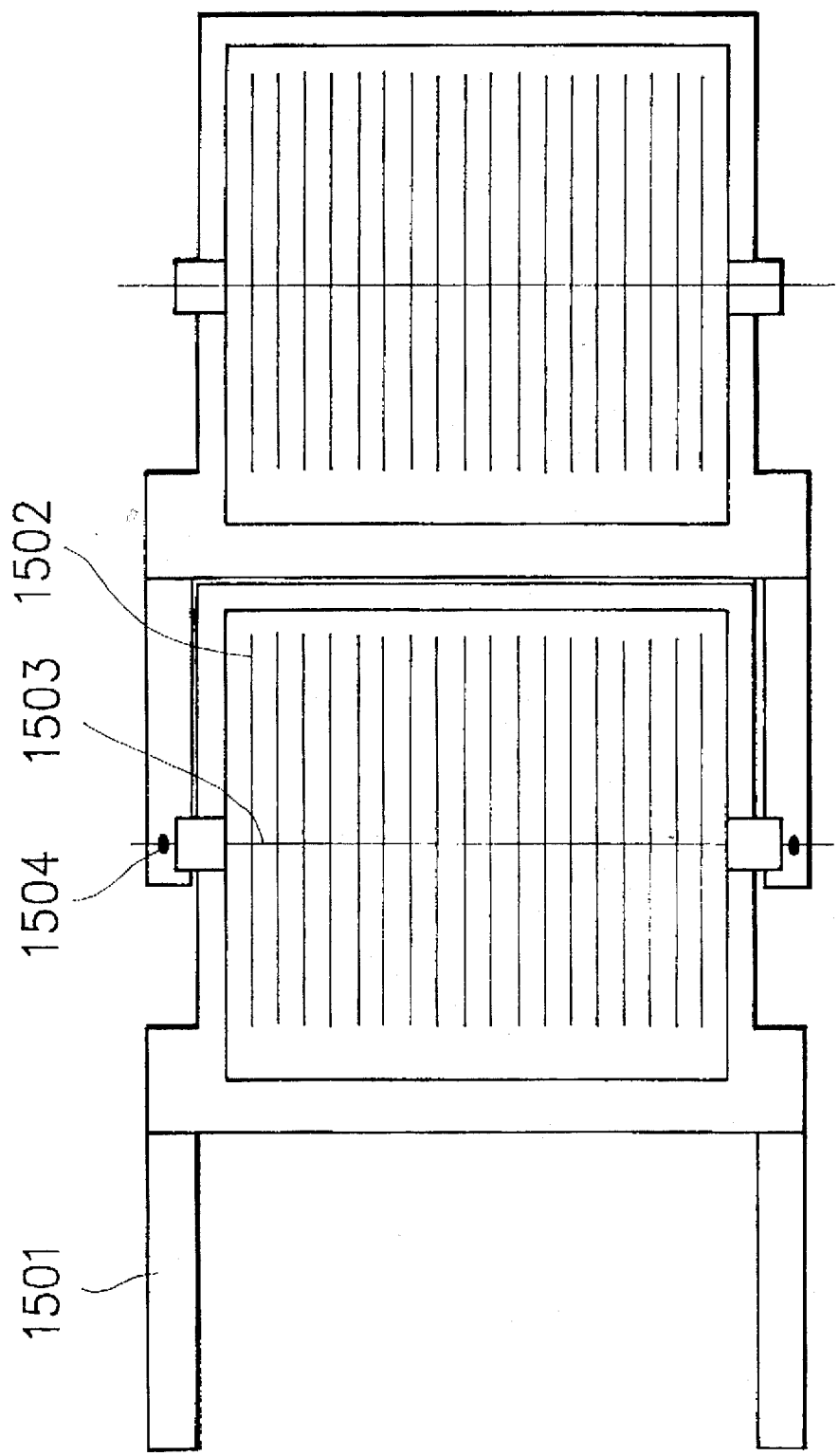
FIG. 15 is a schematic view for explaining a manner of serially integrating a plurality of solar cell elements in a solar cell module according to the present invention.

FIG. 15 is a schematic view of an example of a solar cell comprising a plurality solar cell elements integrated in series connection. In FIG. 15, reference numeral 1501 indicates a metal foil for the series connections, reference numeral 1502 a collecting electrode, reference numeral 1503 a bus bar (which serves to transport electric current collected by the collecting electrode), and reference numeral 1504 a soldered connection. In the solar cell shown in FIG. 15, not only each electrical wiring but also each soldered connection is positioned at an end portion of each of the solar cell elements integrated in series connection in order to avoid occurrence of problems which occur because when the electrical wirings are disposed under the solar cell elements, the thickness of each solar cell element unavoidably increases and this makes it necessary to increase the thickness of the filler and also a certain clearance is liable to be caused during the lamination process for obtaining a solar cell module. Referring to FIGS. 14(A) and 14(B), it is understood that the respective electrical wirings and soldered connections are situated in the region near the heat-fused portion.

In view of the above it is understood that when the thickness of the filler is more or less the same as that of the solar cell, the thickness of the filler around the solar cell is remarkably thin. In this situation, if heat fusion is conducted in order to establish a heat-fused portion, a problem unavoidably entails such that the thermal energy needed for the heat fusion is liable to transmit through the filler and arrive at the electrical wirings and soldered connections of the solar cell, wherein the solders of the soldered connections are melted in the worst case. In the case where such a problem occurs, the resistance of the electrical wirings becomes great enough to reduce the photoelectric conversion efficiency exhibited by the solar cell module, or in the worst case, the constituent solar cell elements of the solar cell are disconnected, whereby the solar cell module exhibits zero photoelectric conversion efficiency.

Hence, as above described based on the results shown in FIG. 17, it is understood that the thickness A is necessary to be at least 200 μm.

FIG. 21 is a graph of the results obtained as a result of observing a plurality of solar cell modules of different thickness A in the range of 100 to 1500 μm and each containing a solar cell of 225 μm in thickness, with respect to interrelations between the thickness A of the filler dedicated for heat fusion and the photoelectric conversion efficiency exhibited by the solar cell module.

Particularly, a plurality of solar cell module samples of the configuration shown in FIGS. 14(A) and 14(B), each having a different thickness A in the range of 100 μm to 1500 μm, were prepared, and each of the resultant solar cell module samples was subject to measurement of its initial photoelectric conversion efficiency by means of the foregoing solar cell simulator (trademark name: SPI-SUN SIMULATOR 240A (AM 1.5), produced by SPIRE Company). The results obtained are graphically shown in FIG. 21.

Each solar module sample was prepared in the following manner. That is, a 50 μm thick nylon film (trademark name: DARTEK, produced by Du Pont Company) as the back face protective layer 1404, an ethylene-vinyl acetate copolymer (EVA) member (A-9918 Formulation, produced by Mobay Company) having a different thickness in the range of 50 to 750 μm as the filler 1402, a solar cell 1403 of 225 μm in thickness comprising a plurality of solar cell elements, each having the configuration shown in FIG. 11, integrated in series connection as shown if FIG. 14(B), an ethylene-vinyl acetate copolymer (EVA) member (A-9918 Formulation, produced by Moday Company) having a different thickness in the range of 50 to 750 μm as the filler 1402, and a 50 μm thick ethylenetetrafluoroethylene film (trademark name: AFLEX (non-extended), produced by Asahi Glass Co., Ltd.) as the surface protective layer 1401 were stacked in this order to obtain a stacked body. The stacked body was placed in a vacuum vessel, wherein it was subjected to heat treatment at 150° C. for 30 minutes while evacuating the inside of the vacuum vessel to a predetermined vacuum degree, followed by cooling to room temperature. The resultant was then subjected to ultrasonic bonding, wherein each of the four side end portions thereof was heat-fused so as to weld the surface protective layer with the back face protective layer whereby four heat-fused portions 1405 were formed. The distance B between each of the opposite end portions of the solar cell 1403 and the front end portion of the corresponding heat-fused portion 1405 was made constant at 1.2 mm in each solar cell module sample.

Each of the resultant solar cell module samples was subjected to measurement of its initial photoelectric conversion efficiency by means of the foregoing solar cell simulator. The results obtained are graphically shown in FIG. 21 as a function of the thickness A.

Based on the results shown in FIG. 21, it is understood that any of the solar cell module samples in which the thickness A is 300 μm or more is satisfactory in terms of the initial photoelectric conversion efficiency.

By combining the results shown in FIG. 21 with the results shown in FIG. 17, it was determined that when the thickness A is equal to or greater than a thickness (μm) obtained from the equation: (the thickness (μm) of the solar cell)+75 μm, a desirable solar cell module can be obtained without the solder of the electrical wiring connections suffering any negative influence from the thermal energy caused by forming the heat-fused portions.

In view of this, it is understood that the upper limit for the thickness A is 1400 μm.

Figure 18:
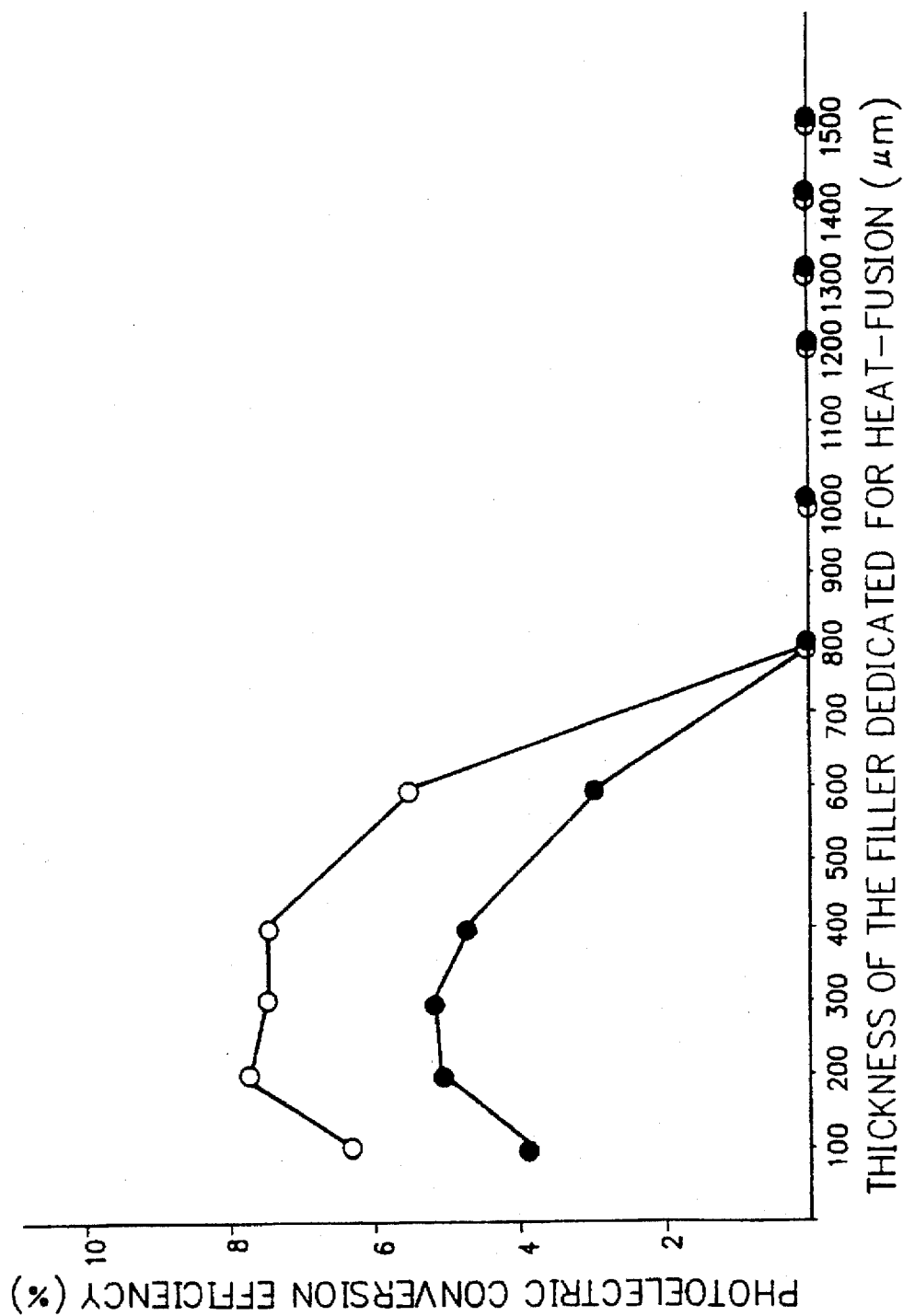
FIG. 18 shows another graph of the experimental results with respect to interrelations between the thickness of a filler in a solar cell module in which a given portion of the surface protective layer is thermally welded with the corresponding portion of the back face protective layer and photoelectric conversion efficiency provided by said solar cell module.

FIG. 18 is a graph of the results obtained from a plurality of solar cell modules, each being of different thickness A in the range of 100 to 1500 μm, each containing a solar cell of 125 μm in thickness of each having a distance B of 0.1 mm with respect to interrelations between the thickness A of the filler dedicated for heat fusion and the photoelectric conversion efficiency exhibited by the solar cell module.

Particularly, a plurality of solar cell module samples of the configurations shown in FIGS. 14(A) and 14(B), each having a distance of 0.1 mm and a different thickness A in the range of 100 μm to 1500 μm, were prepared, and each of the resultant solar cell module samples was subjected to measurement of its initial photoelectric conversion efficiency and its photoelectric conversion efficiency after having been exposed to sunlight outdoors for 3 months (this latter photoelectric conversion efficiency will be hereinafter referred to as photoelectric conversion efficiency after exposure) by means of the foregoing solar cell simulator (trademark name: SPI-SUN SIMULATOR 240A (AM 1.5), produced by SPIRE Company). The results obtained are graphically shown in FIG. 18.

Each solar module sample was prepared in the following manner. That is, a 50 μm thick nylon film (trademark name: DARTEK, produced by Du Pont Company) as the back face protective layer 1404, an ethylene-vinyl acetate copolymer (EVA) member (A-9918 Formulation, produced by Mobay Company) having a different thickness in the range of 50 to 750 μm as the filler 1402, a solar cell 1403 of 125 μm in thickness comprising a plurality of solar cell elements, each having the configuration shown in FIG. 11, integrated in series connection as shown in FIG. 14(B), an ethylene-vinyl acetate copolymer (EVA) member (A-9918 Formulation, produced by Mobay Company) having a different thickness in the range of 50 to 750 μm as the filler 1402, and a 50 μm thick ethylenetetrafluoroethylene film (trademark name: AFLEX (non-extended), produced by Asahi Glass Co., Ltd.) as the surface protective layer 1401 were stacked in this order to obtain a stacked body. The stacked body was placed in a vacuum vessel, wherein it was subjected to heat treatment at 150° C. for 30 minutes while evacuating the inside of the vacuum vessel to a predetermined vacuum degree, followed by cooling to room temperature. The resultant was then subjected to ultrasonic bonding, wherein each of the four side end portions thereof was heat-fused so as to weld the surface protective layer with the back face protective layer whereby four heat-fused portions 1405 were formed. The distance B between each of the opposite end portions of the solar cell 1403 and the front end portion of the corresponding heat-fused portion 1405 was made constant at 0.1 mm in each solar cell module sample.

Each of the resultant solar cell module sample thus obtained was subjected measurement of its initial photoelectric conversion efficiency (open circles ○ in FIG. 18) and its photoelectric conversion efficiency after exposure by means of the foregoing solar cell simulator (solid circles ● in FIG. 18). The results obtained are graphically shown in FIG. 18 as a function of the thickness A.

From the results shown in FIG. 18, it is understood that each of the solar cell module samples is poor in terms of the photoelectric conversion efficiency after exposure particularly the solar cell module samples in which the thickness A is beyond 600 μm are markedly poor in terms of the photoelectric conversion efficiency after exposure. As for the reason of this, it is considered that because the distance B of 0.1 μm is excessively small, the heat-fused portions in these solar cell module samples could not be established as desired in each solar cell module sample. As for the remaining solar cell module samples in which the thickness A is 800 μm or more, it is understood that each of them exhibited zero photoelectric conversion efficiency. As for the reason of this, it is considered that thin the remaining solar cell module samples, the solder of their electrical wiring connections was melted to disconnect their constituent solar cell elements.

FIG. 19 is a graph of the results obtained from having observed a plurality of solar cell modules each having a different thickness A in the range of 100 to 1500 μm, each containing a solar cell of 125 μm in thickness and each having a distance B of 0.5 mm with respect to interrelations between the thickness A of the filler dedicated for heat fusion and the photoelectric conversion efficiency exhibited by the solar cell module.

Particularly, a plurality of solar cell module samples of the configuration shown in FIGS. 14(A) and 14(B), each having a distance B of 0.5 mm and each having a different thickness A in the range of 100 μm to 1500 μm, were prepared, and each of the resultant solar cell module samples was subjected to measurement of its initial photoelectric conversion efficiency and its photoelectric conversion efficiency after having been exposed to sunlight outdoors for 3 months (this latter photoelectric conversion efficiency will be hereinafter referred to as photoelectric conversion efficiency after exposure) by means of the foregoing solar cell simulator (trademark name: SPI-SUN SIMULATOR 240 A (AM 1.5), produced by SPIRE Company). The results obtained are graphically shown in FIG. 19.

Each solar module sample was prepared in the following manner. That is, a 50 μm thick nylon film (trademark name: DARTAK, produced by Du Pont Company) as the back face protective layer 1404, an ethylene-vinyl acetate copolymer (EVA) member (A-9918 Formulation, produced by Mobay Company) having a different thickness in the range of 50 to 750 μm as the filler 1402, a solar cell 1403 of 125 μm in thickness comprising a plurality of solar cell elements, each having the configuration shown in FIG. 11, integrated in series connection as shown in FIG. 14(B), an ethylene-vinyl acetate copolymer (EVA) member (A-9918 Formulation, produced by Moday Company) having a different thickness in the range of 50 to 750 μm as the filler 1402, and a 50 μm thick ethylenetetrafluoroethylene film (trademark name: AFLEX (non-extended), produced by Asahi Glass Co., Ltd.) as the surface protective layer 1401 were stacked in this order to obtain a stacked body. The stacked body was placed in a vacuum vessel, wherein it was subjected to heat treatment at 150° C. for 30 minutes while evacuating the inside of the vacuum vessel to a predetermined vacuum degree, followed by cooling to room temperature. The resultant was then subjected to ultrasonic bonding, wherein each of the four side end portions thereof was heat-fused so as to weld the surface protective layer with the back face protective layer whereby four heat-fused portions 1405 were formed. The distance B between each of the opposite end portions of the solar cell 1403 and the front end portions of the corresponding heat-fused portion 1405 was made constant at 0.5 mm in each solar cell module sample.

Each of the resultant solar cell module samples thus obtained was subjected to measurement of its initial photoelectric conversion efficiency (open circles ○ in FIG. 19) and its photoelectric conversion efficiency after exposure (solid circles ● in FIG. 19) by means of the foregoing solar cell simulator. The results obtained are graphically shown in FIG. 19 as a function of the thickness A.

From the results shown in FIG. 19, it is understood that the solar cell module samples in which the thickness A is beyond 600 μm are remarkably poor in terms of the photoelectric conversion efficiency after exposure. The reason of this is considered that each of the opposite heat-fused portions in each of these solar module samples initiated at a position less than that obtained from the equation: (the thickness A (μm) of the filler dedicated for heat fusion)×0.8 and because of this, the heat-fused portions could not be established as desired in each of these solar cell module samples.

From the above-described findings, it is understood that it is necessary for the distance B to be equal to or greater than a value (μm) obtained from the equation: (the thickness A (μm) of the filler dedicated for heat fusion)×0.8 and for the thickness A of the filler dedicated for heat fusion to be in the range of from a value (μm) obtained from the equation: (the thickness (μm) of the solar cell disposed in a solar cell module)+75 μm to 1400 μm, in order to obtain a desirable solar cell module.

Now, in the present invention, any of the conventional layer-bonding methods utilizing thermal energy may be employed in the formation of the foregoing heat-fused portion in order to produce a solar cell module according to the present invention.

Such layer-bonding methods which can be employed in the present invention can be categorized into a method in which films are placed between opposite electrodes and press-heated by the two electrodes while applying thermal energy thereto to weld them and another method in which films are heated and melted by virtue of a high frequency or a mechanical vibration to weld them. The former method can include the heat sealing and impulse sealing methods. The latter method can include, other than the ultrasonic bonding method employed in the foregoing experiments, the high-frequency sealing method.

The heat sealing method is not suitable in the case of the polyethylene terephthalate film since the film is of a high melting point, but it is suitable for the nylon, polyethylenetetrafluoroethylene, polyethylene trifluoride, and polyvinyl fluorinde films.

As in the case of the heat sealing method the impulse sealing method is not suitable in the case of the polyethylene terephthalate film since the film is of a high melting point, but it is suitable for the nylon, polyethylenetetrafluoroethylene, polyethylene trifluoride, and polyvinyl fluoride films.

The high-frequency sealing method is suitable for the nylon films since they are relatively large in terms of dielectric loss, but it is not suitable for the polyethylenetetrafluoroethylene, polyethylene trifluoride, polyvinyl fluoride, and polyethylene terephthalate films since these films are relatively small in terms of the dielectric loss.

The ultrasonic bonding method is suitable for any of the films dedicated for heat-fusion in the present invention.

Particularly, in the case where the back face protective layer is composed of nylon and the surface protective layer is composed of polyethylenetetrafluoroethylene, polyethylene trifluoride, polyvinyl fluoride, the two layers may be welded by means of any of the heat sealing, impulse sealing, and ultrasonic bonding methods.

In the case where the surface protective layer is composed of polyethylenetetrafluoroethylene, polyethylene trifluoride, polyvinyl fluoride, and the back face protective layer is composed of polyethylene terephthalate, the two layers may be welded by means of the ultrasonic bonding method.

In the following, the present invention will be described in more detail with reference to examples, which are not intended to restrict the scope of the present invention.

EXAMPLE 1

In this example, there was prepared a solar cell module of the configuration shown in FIG. 1.

Figure 3:
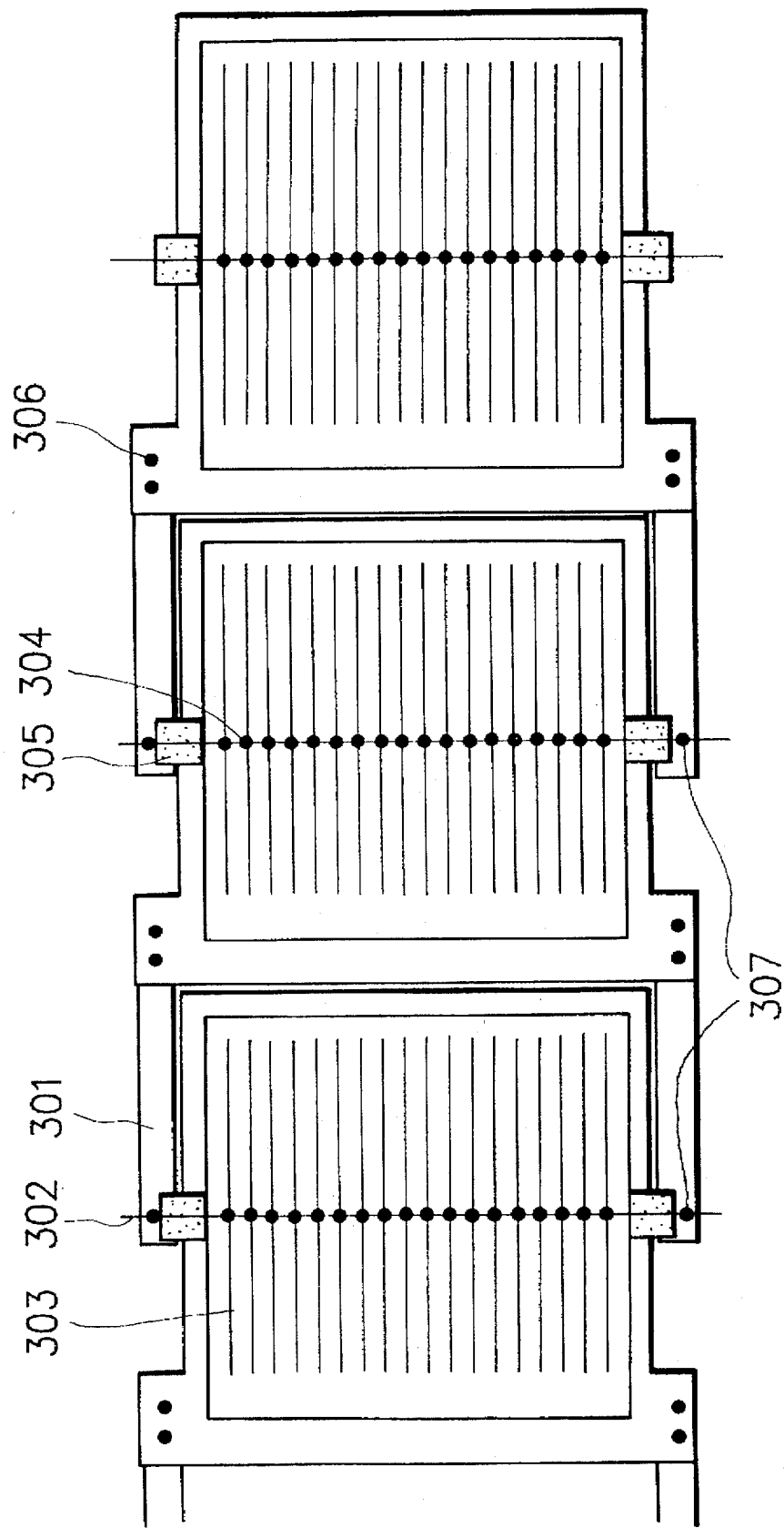
FIG. 3 is a schematic explanatory view of a manner of forming a collecting electrode at a solar cell element and serially integrating a plurality of solar cell elements each having such collecting electrode in the present invention.

Firstly, there was prepared a solar cell comprising a plurality of solar cell elements integrated in series electrical connection as shown FIG. 3.

In FIG. 3, reference numeral 301 indicates a metal foil, reference numeral 302 a bus bar, reference numeral 303 a collecting electrode, reference numeral 304 an adhesive Ag-ink, reference numeral 305 an insulative tape, reference numeral 306 a spot welded portion, and reference numeral 307 a soldered connection.

The solar cell was prepared in the following manner. That is, there was firstly provided a long substrate web of 0.125 mm in thickness made of stainless steel. On the substrate web, there was formed a two-layered back reflecting layer comprising a 3000 Å thick Al film and a 700 Å thick ZnO film by means of the conventional sputtering method, followed by forming, on the back reflecting layer, a 4000 Å thick three-layered semiconductor layer with a pin junction comprising an n-type a-Si layer, an i-type a-Si layer, and a p-type microcrystalline Si layer by means of the conventional plasma CVD method. Then, on the semiconductor layer, there was formed a 750 Å thick transparent and conductive layer composed of $In_2O_3$ by means of the conventional heat resistance evaporation method wherein an In source was evaporated in an $O_2$ atmosphere.

The resultant was cut into a plurality of solar cell elements of 300 mm length×150 mm width using a press machine. Each of the solar cell elements thus obtained was subjected to etching treatment in a manner shown in FIG. 8.

Figure 8:
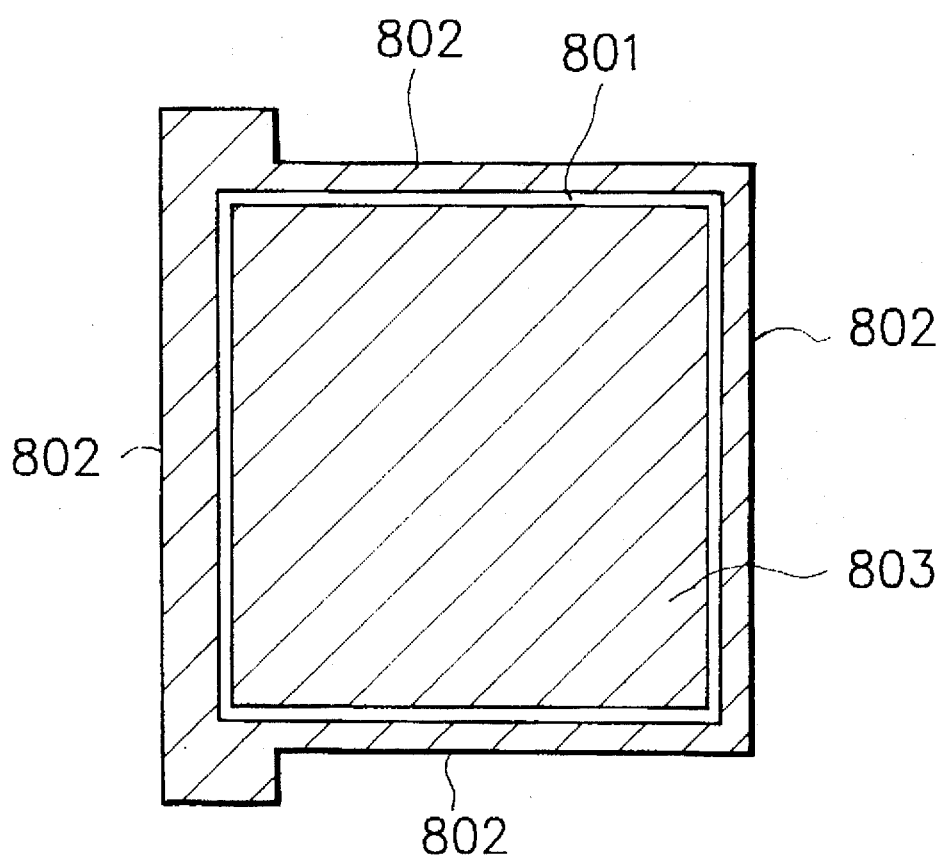
FIG. 8 is a schematic view for explaining a manner of obtaining a solar cell element in process by cutting a stacked body provided with a transparent and conductive layer and etching the solar cell element in process.

In FIG. 8, reference numeral 801 indicates a portion of the cut solar cell element to which an etching material is to be printed, and reference numeral 802 a cut face of the cut solar cell element. Reference numeral 803 indicates an isolation region of the transparent and conductive layer. Herein, each of the cut solar cell elements has four cut faces 802 wherein that transparent and conductive layer is short-circuited with the stainless steel substrate.

In order to repair such short-circuited defect, portions of the transparent and conductive layer situated in the vicinity of the four cut faces were removed by means of the selective etching method. That is, firstly, an $FeCl_3$ etching solution capable of selectively dissolving the transparent and conductive layer ($In_2O_3$) but not dissolving the semiconductor layer was applied to the peripheral portions 801 of the transparent and conductive layer by means of the screen printing technique to there by remove said peripheral portions. The resultant was washed with pure water. Thus, there were obtained a plurality of defect-free solar cell elements.

As for each of the solar cell elements thus obtained, an Ag-paste comprising powdered Ag dispersed in polyester resin (trademark name: Ag-paste No. 5007, produced by DuPont Company) was screen-printed on the transparent and conductive layer, followed by drying at 150° C. for 60 minutes, to thereby form a collecting electrode thereon. Thereafter, a bus bar comprising a Sn-coated Cu wire (302 in FIG. 3) of 0.4 mm in diameter was arranged on the collecting electrode in an orthogonal array as shown in FIG. 3. Then, an adhesive Ag-ink (304 in FIG. 3) (trademark name: C-220, produced by Emerson and Cuming, Inc.) was applied to each intersection with the collecting electrode, followed by drying at 150° C. for 60 minutes, to thereby electrically connect the collecting electrode with the bus bar. In this case, in order to prevent the bus bar from being electrically contacted with the stainless steel substrate, an insulative polyimide tape (305 in FIG. 3) was fixed to each portion where the bus bar was liable to contact the stainless steel substrate. Successively, a part of the non-power generation region of the solar cell element was removed by means of a grinder to expose a portion of the stainless steel substrate. Thereafter, a metal foil made of Cu (301 in FIG. 3) was fixed to the exposed portion by means of a spot welding machine (306 in FIG. 3).

The resultant solar cell elements were integrated in series connection as shown in FIG. 3 by soldering the bus bar (302) of one solar cell with the metal foil (301) of the other solar cell element (307 in FIG. 3). Output wiring was conducted on the rear side of the stainless steel substrate (not shown in the figure).

Thus, the preparation of the solar cell was completed.

Using the solar cell thus obtained, there was prepared a solar cell module of the configuration shown in FIG. 1.

That is, a 50 µm thick ethylenetetrafluoroethylene film (trademark name: AFLEX (non-extended), produced by Asahi Glass Co., Ltd.) as the surface protective layer 106, a 460 µm thick ethylene-vinyl acetate copolymer (EVA) member (A-9918 Formulation, produced by Mobay Company) as the filler 105, the solar cell 102 obtained in the above, a 460 µm thick ethylene-vinyl acetate copolymer (EVA) member (A-9918 Formulation, produced by Mobay Company) as the filler 105, a 50 µm thick nylon film (trademark name: DARTEK, produced by Du Pont Company) as the back face protective layer 104, and a 460 µm thick ethylene-vinyl acetate copolymer (EVA) member (A-9918 Formulation, produced by Mobay Company) as the filler 105' were laminated in this order on a 0.27 mm thick Zn-coated Cu plate (trademark name: RAIMA COLOR GL, produced by Daidokohan Kabushiki Kaisha) as the back face reinforcing member 103. The stacked body thus obtained was placed in a vacuum vessel, wherein it was subjected to heat treatment at 150° C. for 30 minutes while evacuating the inside of the vacuum vessel to a predetermined vacuum degree, followed by cooling to room temperature.

Observation was made of the thickness of the filler situated outside the solar cell between the surface protective layer and the back face protective layer. As a result, it was found to be 920 µm.

The resultant was then subjected to ultrasonic bonding, wherein each of the four side end portions (1.5 mm distant from the corresponding end portion of the solar cell) was heat-fused by ultrasonic bonding wherein the ultrasonic vibration transducer tip was contacted to the four side end portions to apply ultrasonic vibration for about 10 seconds under conditions of 25,000 vibrations per second of 0.03 mm in amplitude. As a result, the surface protective layer was welded with the back face protective layer where the filler was melted out, to thereby form four heat-fused portions 101 in a desirable state. During this heat fusion treatment, the temperature of the surface protective layer was measured and found to be 260° C.

In this way, there were obtained three solar cell modules.

EXAMPLE 2

The procedures of Example 1 were repeated, except that the thickness of the filler between the surface protective layer and back face protective layer was changed to 100 µm, and the application of the ultrasonic vibration was conducted for about 0.5 second under conditions of 25,000 vibrations per second of 0.03 mm in amplitude, to thereby obtain three solar cell modules.

During the heat fusion treatment, the temperature of the surface protective layer was measured and found to be 240° C.

EXAMPLE 3

The procedures of Example 1 were repeated, except that the thickness of the filler between the surface protective layer and back face protective layer was changed to 1500 μm, and the application of the ultrasonic vibration was conducted for about 27 seconds under conditions of 25,000 vibrations per second of 0.03 mm in amplitude, to thereby obtain three solar cell modules.

During this heat fusion treatment, the temperature of the surface protective layer was measured and found to be 340° C.

EXAMPLE 4

The procedures of Example 1 were repeated, except that the ultrasonic vibration treatment was conducted for each of the four side end portions 0.5 mm distant from the corresponding end portions of the solar cell, to thereby obtain three solar cell modules.

EXAMPLE 5

Figure 2A:
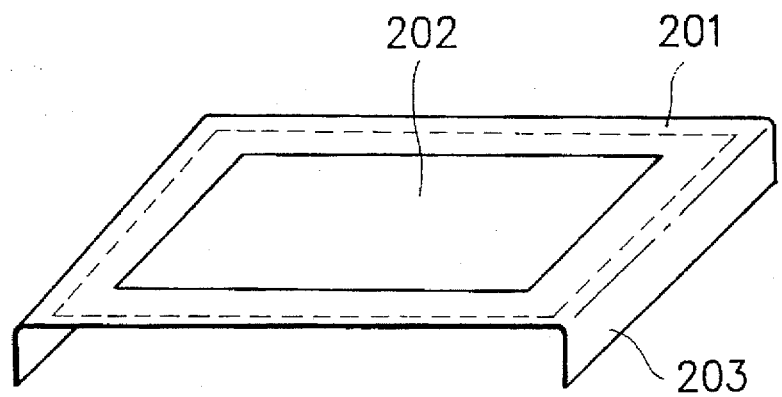
FIG. 2. (A) is a schematic perspective plan view illustrating a solar cell module obtained in Example 1 of the present invention which will be later described, in which a given portion of the surface protective film is thermally welded with the corresponding portion of the back surface protective film.
FIG. 2(B) is a schematic cross-sectional view of the principal part of the solar cell module shown in FIG. 2(A).
Figure 2B:
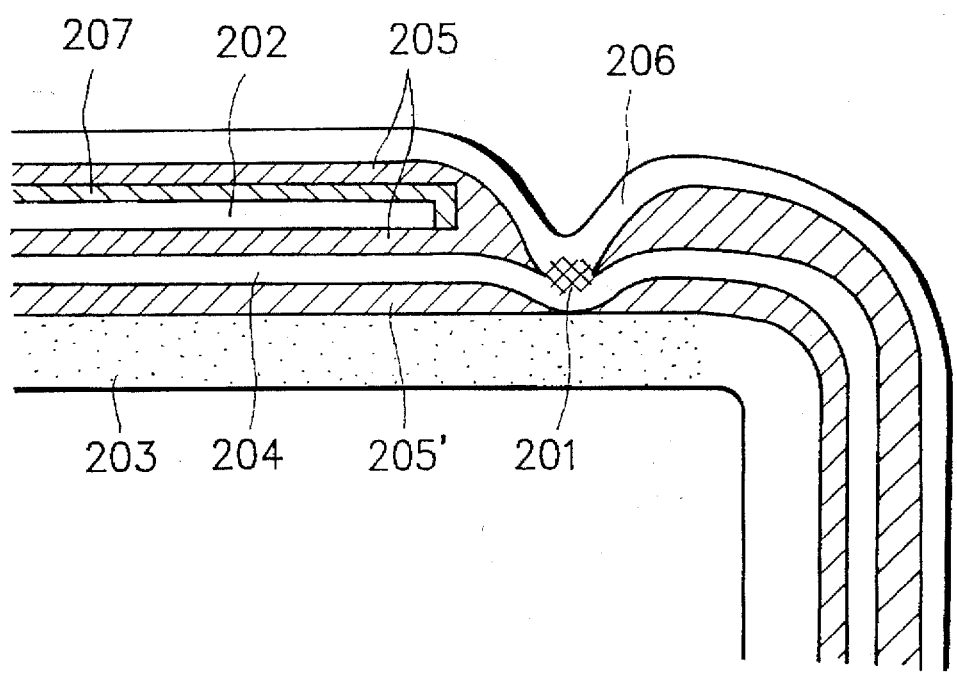

In this example, there was prepared a solar cell module of the configuration shown in a schematic perspective view of FIG. 2(A) and a schematic crossectional view of FIG. 2(B), which has opposing bent portions.

The solar cell module shown in FIGS. 2(A) and 2(B) is of the same configuration of the solar cell module shown in FIG. 1, except that it has a moisture preventive layer disposed so as to encircle the solar cell except for the back side thereof and opposing bent portions containing no solar cell.

In FIGS. 2(A) and 2(B), reference numeral 201 indicates a heat-fused portion, reference numeral 202 a solar cell, reference numeral 203 a back face reinforcing member, reference numeral 204 a back face protective layer, each of reference numerals 205 and 205' a filler, reference numeral 206 a surface protective layer, and reference numeral 207 a moisture preventive layer.

The solar cell module was prepared by repeating the procedures of Example 1, except that an acrylic resin silicone polymer type paint was applied on the solar cell 202 to thereby form a moisture protective layer 207 thereon as shown in FIG. 2(B) and that opposite end portions of the solar cell module were bent after the ultrasonic vibration treatment.

Particularly, the formation of the moisture preventive layer was conducted by applying an acrylic resin-silicone polymer paint (trademark name: FINEHARD N300G, produced by Tohnen Kabushiki Kaisha) in an amount to provide a thickness of 40 μm when dried on the solar cell and drying the resultant at 80° C. for 10 minutes in order to vaporize the solvent and then at 170° C. for 20 minutes in order to finish the layer. The formation of the opposing bent portions was conducted by bending each of the opposite portions of the solar cell module after conducting the ultrasonic vibration treatment through the back face reinforcing member at a position of 5 mm distant from the corresponding end portion of the heat-fused portion 201 such that a radius R of 1 mm was provided at the bent portion.

In this way, there were obtained three solar cell modules.

EXAMPLE 6

The procedures of Example 5 were repeated, except that the thickness of the filler dedicated for heat fusion was changed to 200 μm, and the application of the ultrasonic vibration was conducted for about 0.5 second under conditions of 25,000 vibrations per second of 0.03 mm in amplitude, to thereby obtain three solar cell modules.

In the above, during this heat fusion treatment, the temperature of the surface protective layer was measured and found to be 240° C.

EXAMPLE 7

The procedures of Example 5 were repeated, except that the thickness of the filler dedicated for heat fusion was changed to 1500 μm, and the application of the ultrasonic vibration was conducted for about 27 seconds under conditions of 25,000 vibrations per second of 0.03 mm in amplitude, to thereby obtain three solar cell modules.

In the above, during this heat fusion treatment, the temperature of the surface protective layer was measured and found to be 340° C.

EXAMPLE 8

The procedures of Example 5 repeated, except that the ultrasonic vibration treatment was conducted for each of the four side end portions 0.5 mm distant from the corresponding end portions of the solar cell, to thereby obtain three solar cell modules.

EXAMPLE 9

In this example, there was prepared a solar cell module of the configuration shown in a schematic perspective view of FIG. 4(A) and a schematic cross-sectional view of FIG. 4(B), which has opposite bent portions.

The solar cell module shown in FIGS. 4(A) and 4(B) is of the same configuration as the solar cell module shown in FIG. 1, except that it has a moisture preventive layer disposed so as to encircle the solar cell except for the back side thereof and opposing bent portions containing no solar cell.

In FIGS. 4(A) and 4(B), reference numeral 401 indicates a heat-fused portion, reference numeral 402 a solar cell, reference numeral 403 a surface protective layer, reference numeral 404 a back face protective layer, reference numeral 405 a back face reinforcing member, each of reference numerals 406 and 406' a filler, and reference 407 a moisture preventive layer.

The solar cell module was prepared by repeating the procedures of Example 1, except that an acrylic resin silicone polymer type paint was applied on the solar cell 402 to thereby form a moisture protective layer 407 thereon as shown in FIG. 4(b) and that each of the four heat-fused portions was formed at a position 10 mm distant from the corresponding end portion of the solar cell, and extended opposing end portions of the solar cell module were bent after the ultrasonic vibration treatment was conducted.

Particularly, the formation of the moisture preventive layer was conducted by applying an acrylic resin-silicone polymer paint (trademark name: FINEHARD N300G, produced by Tohnen Kabushiki Kaisha) in an amount to provide a thickness of 40 μm when dried on the solar cell and drying the resultant at 80° C. for 10 minutes in order to vaporize the solvent and then at 170° C. for 20 minutes in order to finish the layer. The ultrasonic vibration treatment was conducted at a desired position of each of the four extended non-solar cell side portions of the solar cell module so that four heat-fused portions were established at a position 10 mm distant from the corresponding end portion of the solar cell, and the formation of the opposing bent portions was conducted by bending each of the opposing portions of the solar cell module through the back face reinforcing member at a position 5 mm distant from the corresponding end portion of the heat-fused portion 401 in the solar cell side such that a radius R of 1 mm was provided at the bent portion.

In this way, there were obtained three solar cell modules.

EXAMPLE 10

Figure 5A:
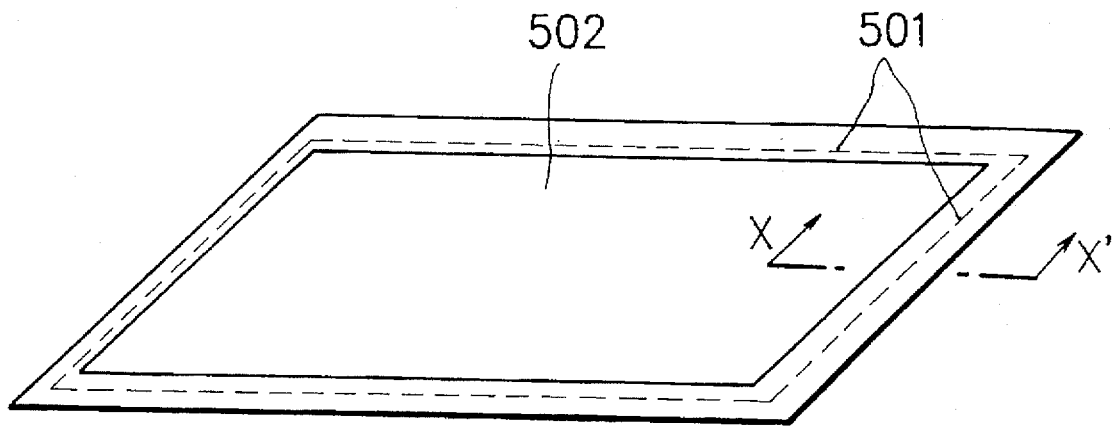
FIG. 5(A) is a schematic perspective view illustrating a solar cell module obtained in Example 10 of the present invention which will be later described, in which a given portion of the surface protective film is thermally welded with the corresponding portion of the back face protective film.
Figure 5B:
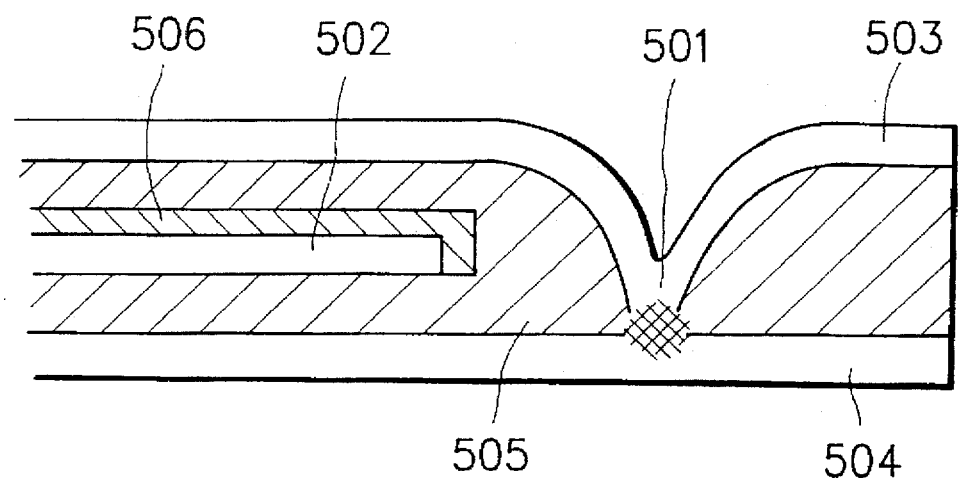
FIG. 5(B) is a schematic cross-sectional view of the principal part of the solar cell module shown in FIG. 5(A).

In this example, there was prepared a solar cell module shown in a schematic plan view of FIG. 5(A) and in a schematic cross-sectional view of FIG. 5(B) (which is taken along line Y–Y' in FIG. 5(A)).

The solar cell module shown in FIGS. 5(A) and 5(B) is a modification of the solar cell module shown in FIGS. 2(A) and 2(B), in which the filler 205' and the back face reinforcing member 203 shown in FIG. 2(B) are omitted. Also, the solar cell module shown in FIGS. 5(A) and 5(B) does not have opposing bent portions as in the solar cell module shown in FIGS. 2(A) and 2(B).

In FIGS. 5(A) and 5(B), reference numeral 501 indicates a heat-fused portion, reference numeral 502 a solar cell, reference numeral 503 a surface protective layer, reference numeral 504 a back face protective layer, reference numeral 505 a filler, and numeral reference 506 a moisture preventive layer.

The procedures of Example 5 were repeated, except neither the filler 205' nor the back face reinforcing member 203 used in Example 5 were used, the ultrasonic vibration treatment for the four side end portions of the solar cell module was conducted on an iron plate of 50 W/m.K.s. in thermal conductivity, and opposing end portions of the solar cell module subjected to the ultrasonic vibration treatment were not bent.

In this way, there were obtained three solar cell modules.

EXAMPLE 11

In this example, there was prepared a solar cell module provided with a back face reinforcing member having a relatively low thermal conductivity.

The procedures of Example 5 were repeated without using the filler 205' and the reinforcing member 203, wherein the ultrasonic vibration treatment was not conducted. The resultant solar cell module was placed on an iron plate of 50 W.M.K.s. in thermal conductivity through the back face protective layer, followed by subjecting to ultrasonic vibration treatment in the same manner as in Example 1, to thereby form a heat-fused portion at each of four side end portions. The resultant was adhered through the back face protective layer onto the surface of a 0.27 mm thick member having a relatively low thermal conductivity of 20 W/M.K.s. using an epoxy-liquid type adhesive (trademark name: HAMATITE Y3800, produced by The Yokohama Rubber Co., Ltd.), followed by hardening the adhesive at 120° C. for 40 minutes. Each of the opposing portions of the resultant was bent through the back face reinforcing member at a position of 5 mm distant from the corresponding end portion of the heat-fused portion such that a radius R of 1 mm was provided at the bent portion to thereby form opposing bent portions.

In this way, there were obtained three solar cell modules.

EXAMPLE 12

The procedures of Example 5 were repeated, except that the ultrasonic vibration treatment was conducted only for opposite end portions of the solar cell module, and no bent portion was fomed, to thereby obtain three solar cell modules.

Comparative Example 1

Figure 6:
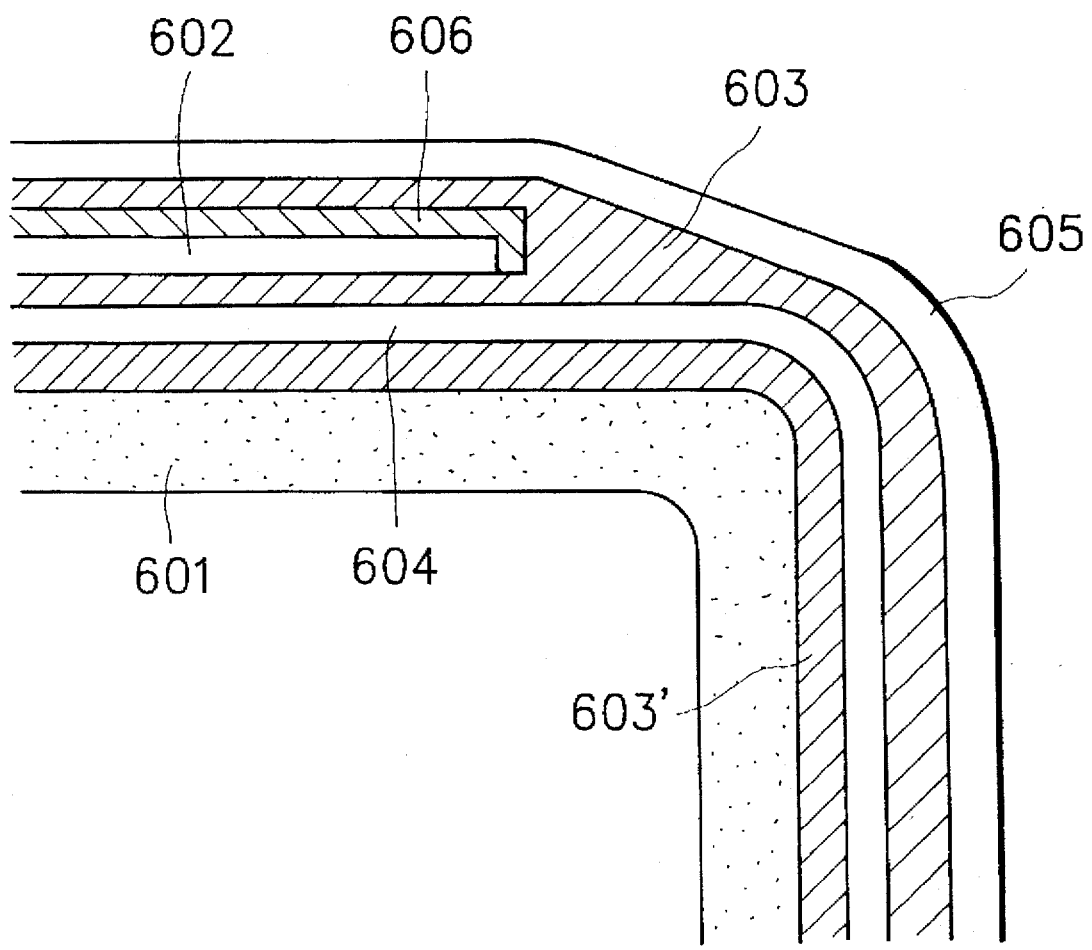
FIG. 6 is a schematic cross-sectional view of the principal part of a comparative solar cell module in a bent form obtained in Comparative Example 1.

A comparative solar cell module as shown in the schematic cross-sectional view of FIG. 6 was prepared.

In FIG. 6, reference numeral 601 indicates a back face reinforcing member, reference numeral 602 a solar cell, each of reference numerals 603 and 603' a filler, reference numeral 604 a back face protective layer, reference numeral 605 a surface protective layer, and reference numeral 606 a moisture preventive layer.

The procedures of Example 5 were repeated, except that no heat-fused portion was formed and the formation of the opposing bent portions was conducted by bending each of the opposing portions of the solar cell module with no heat-fused portion through the back face reinforcing member at a position of 5 mm distant from the corresponding end portion of the solar cell such that a radius R of 1 mm was provided at the bent portion, to thereby form eighteen three comparative solar cell modules.

Comparative Example 2

Figure 7:
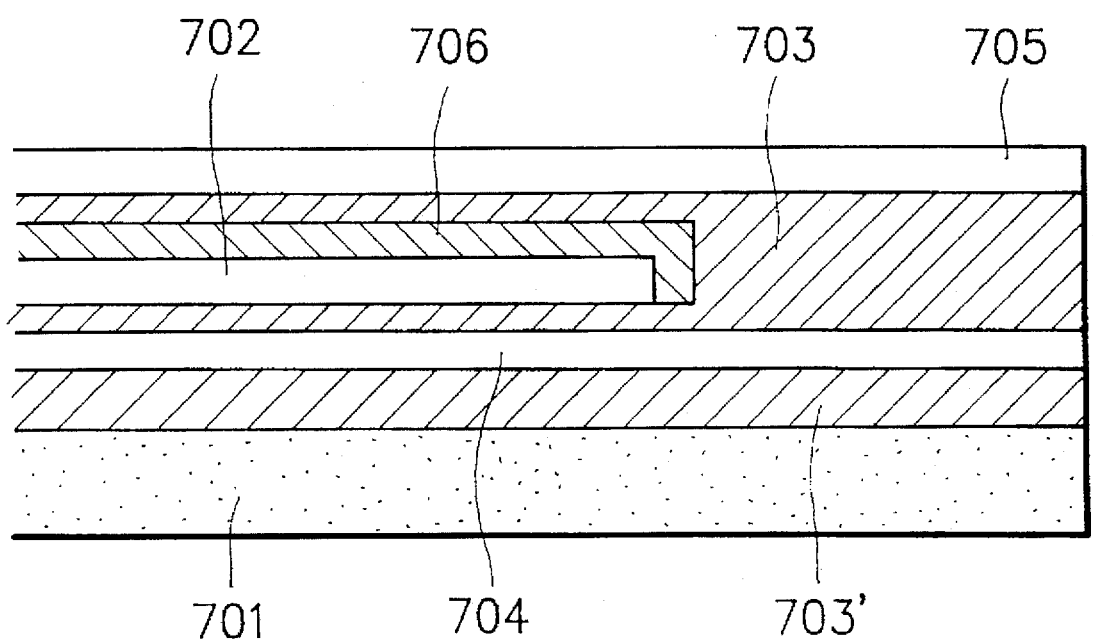
FIG. 7 is a schematic cross-sectional view of a comparative solar cell module in a straight form obtained in Comparative Example 2.

A comparative solar cell module as shown in the schematic cross-sectional view of FIG. 7 having no bent portion was prepared.

In FIG. 7, reference numeral 701 indicates a back face reinforcing member, reference numeral 702 a solar cell, each of reference numerals 703 and 703' a filler, reference numeral 704 a back face protective layer, reference numeral 705 a surface protective layer, and reference numeral 706 a moisture preventive layer.

The procedures of Example 5 were repeated, except that no heat-fused portion was fomed and no bent portion was fomed, to thereby obtain three comparative solar cell modules.

Comparative Example 3

Figure 9A:
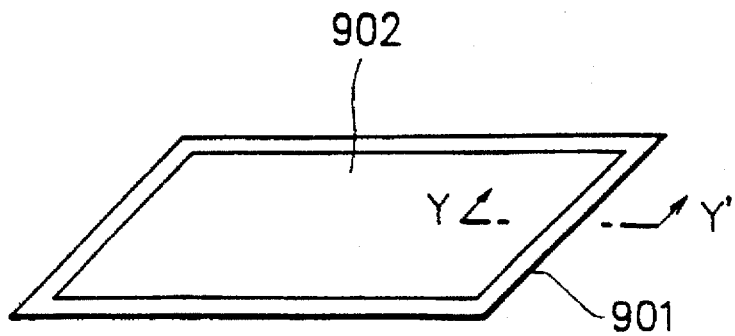
FIG. 9(A) is a schematic perspective plan view of a conventional solar cell module.
Figure 9B:
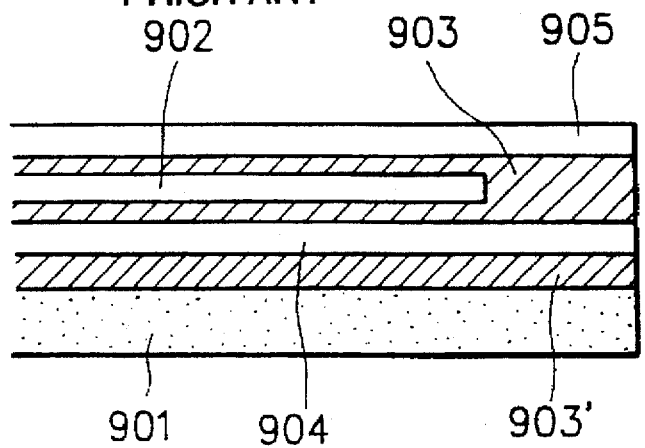
FIG. 9(B) is a schematic cross-sectional view of an end portion of the solar cell module shown in FIG. 9(A) before use, wherein said end portion is corresponding to the portion indicated by broken line Y-Y' in FIG. 9(A).
Figure 9C:
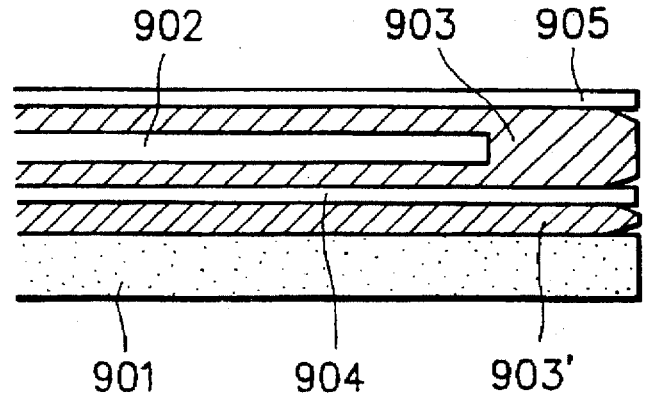
FIG. 9(C) is a schematic cross-sectional view of an end portion of the solar cell module shown in FIG. 9(A) after use, wherein said end portion is corresponding to the portion indicated by broken line Y-Y' in FIG. 9(A).
Figure 10A:
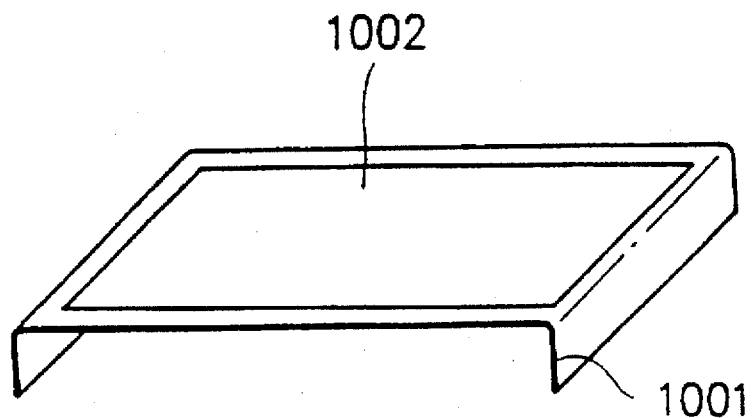
FIG. 10(A) is a schematic perspective view of a conventional bent solar cell module of the configuration shown in FIGS. 9(A) and 9(B) which is suitable for placement on the roof of a building.
Figure 10B:
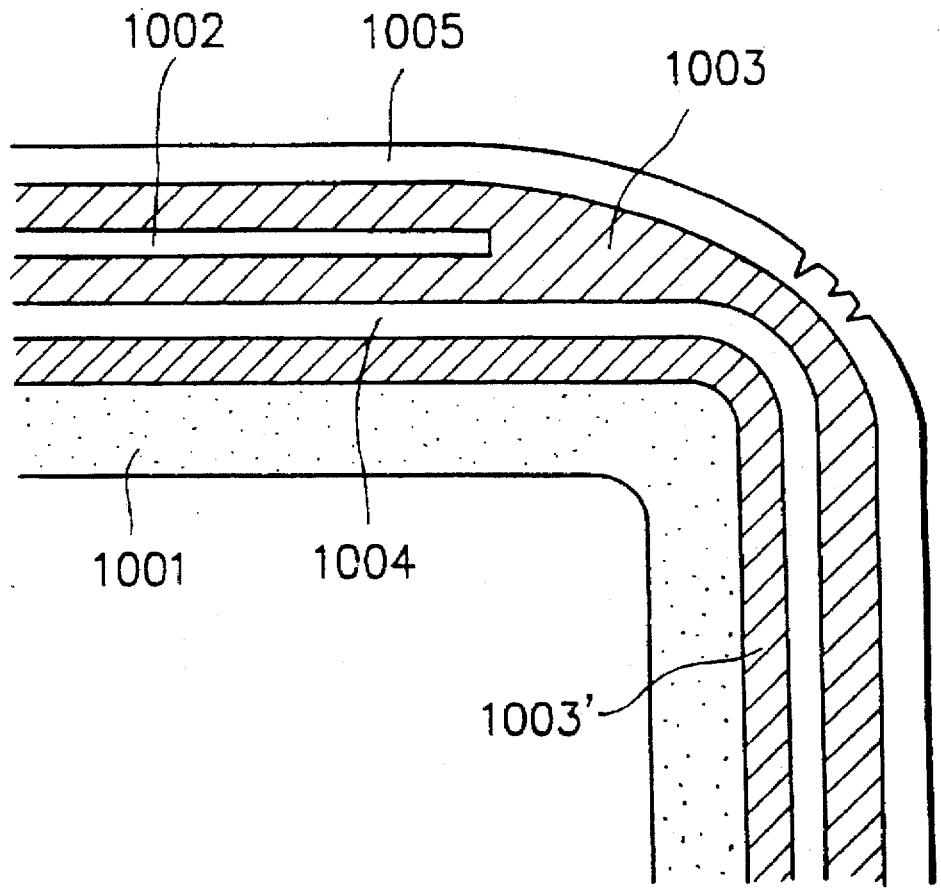
FIG. 10(B) is a schematic cross-sectional view of the principal part (including the bent portion) of the solar cell module shown in FIG. 10(A).

Three comparative solar cell modules of the configuration shown in FIGS. 9(A) and 9(B) (the description of the configuration shown in these figures already has been made) were prepared by repeating the procedures of Example 1, except that no heat-fused portion was fomed and neither a moisture preventive layer nor bent portions were formed.

Evaluation

Each of the solar cell modules obtained in Examples 1 to 12 and each of the comparative solar cell modules obtained in Comparative Examples 1 to 3, were evaluated with respect of (1) initial photoelectric conversion efficiency, (2) photoelectric conversion efficiency after exposure, and (3) adhesion of the heat-fused portion.

The evaluation of each of the items (1) to (3) was conducted in the following manner.

(1) Evaluation of the initial photoelectric conversion efficiency:

Each solar cell module sample was subjected to measurement of its initial photoelectric conversions efficiency by means of a solar cell simulator (trademark name: SPI-SUN SIMULATOR 240A (AM 1.5), produced by SPIRE Company). This measurement was conducted for each of the three samples obtained in each of the examples and comparative examples. Based on the measured values, there was obtained a mean value in terms of the initial photoelectric conversion efficiency. The results obtained are collectively shown in Table. 1.

(2) Evaluation of the photoelectric conversion efficiency after exposure.

Firstly, each solar cell module sample was placed in a sunshine weather meter (Trademark name: SHIMADZU XW-150, produced by Shimadzu Seisakusho Ltd.), wherein the sample was irradiated with pseudo sunlight of 300 to 800 nm in wavelength from a xenon lamp of 1.5 KW output power at an irradiation intensity of 1425 W/cm$^2$ for 3000 hours under a condition of 50/50 for light-dark cycling while repeating a cycle of pure water fall for 17 minutes/non-water fall for 103 minutes. After this, the sample was subjected to measurement of its photoelectric conversion efficiency using the above solar cell simulator. In this way, each of the three samples obtained in each of the examples and comparative examples was measured with respect to its photoelectric conversion efficiency after exposure. Based on the measured values, there was obtained a mean photoelectric conversion efficiency among the three samples. The resultant value was compared with the value obtained in the above measurement (1) to obtain a value (in percentage) relative to the latter value, which was set at 1.

The results obtained are collectively shown in Table 1.

(3) Evaluation of the adhesion of the heat-fused portion:

This evaluation was conducted only for the solar cell modules obtained in Examples 1 to 12, since the comparative solar cell modules obtained in Comparative Examples 1 to 3 are not provided with a heat-fused portion.

The evaluation was conducted in the following manner. That is, for each of the three solar cell modules obtained in each example which were dedicated for the evaluation of the above evaluation items (1) an (2), a part thereof containing the heat-fused portion was cut out to provide a test sample having a width of 25 mm, and the test sample was subjected to the foregoing 180° peel test at a pulling speed of 50 mm/minute and under environmental conditions of 85° C. and 85% Rh. In this way, each of the three samples obtained in each of the examples was measured with respect to adhesion of the heat-fused portion in terms of Kgf/25 mm (width). Based on the measured values, there was obtained a mean adhesion among the three samples.

The results obtained are collectively shown in Table 1.

In Table 1, there is shown a thermal conductivity for the back face reinforcing member in the cases where the back face reinforcing member was used.

From the results shown in Table 1, the following observations are made.

Each of the solar cell modules obtained in Examples 1 to 12 belonging to the present invention surpass the comparative solar cell modules of Cooperative Examples 1 to 3 in terms of the reduction in the initial photoelectric conversion efficiency after having been exposed to sunlight under such severe environmental conditions as above described for 3000 hours. Particularly, each of the solar cell modules experiences only a very slight deterioration of the initial photoelectric conversion after exposure for a long period of time under very severe environmental conditions, but each of the comparative solar cell modules experiences remarkable deterioration of the initial photoelectric conversion efficiency. This means that each of the solar cell modules according to the present invention hardly suffer from water penetration, since they are provided with specific heat-fused portions so that their solar cell disposed therein is tightly water proofed.

From a comparison of the solar cell module obtained in Example 1 with the solar cell modules obtained in Example 5, of the solar cell module obtained in Example 2 with the solar cell module obtained in Example 6, of the solar cell module obtained in Example 3 with the solar cell modules obtained in Example 7, and of the solar cell module obtained in Example 4 with the solar cell module obtained in Example 8, it is understood that the respective latter solar cell modules each having a moisture preventive layer and opposing bent portions surpass the respective former solar cell modules each having no moisture preventative layer and no bent portion. As for the reasons for this situation, it is considered to be due to the fact that each of the latter solar cell modules is provided with a specific moisture preventive layer and opposing bent portions.

It is understood that of the solar ell modules obtained in Examples 1 to 12, the one obtained in Example 1 is inferior in terms of the reduction of the initial photoelectric conversions efficiency after exposure. As for the reasons for this situation, it is considered to be due to the fact that the solar cell module is provided with only two heat-fused portions fomed at opposite side end portions thereof. However, form a comparison of the solar cell module obtained in Example 12 with the comparative solar cell modules with no heat-fused portions with reference to the results shown in Table 1, is it understood that the former surpasses the latter in terms of the reduction of the initial photoelectric conversion efficiency after exposure.

In the case of the solar cell module obtained in Example 9, it is understood that the present deterioration of the initial photoelectric conversion efficiency after exposure is 90%, which is relatively high. As for the reasons of this, it is considered that each of the opposing ben portions is situated between the corresponding end portion of the solar cell and one of the heat-fused portions and because of this, moisture penetrates into the inside through cracks possibly present at the portion of the surface protective layer situated at the bent portion, which exerts a negative influence on the solar cell.

From a comparison of the solar cell module obtained in Example 1 with the solar cell module obtained in Example 3 and of the solar cell module obtained in Example 5 with the solar cell module obtained in Example 7 with reference to the results shown in Table 1, it is understood that making the thickness of the filler between the surface protective layer and the back face protective layer which is dedicated for heat fusion relatively thick leads to some deterioration of the initial photoelectric conversion efficiency, As for the reason for this situation, it is considered that a relatively large quantity of thermal energy is required to provide heat-fused portions in the case where the filler is relatively thick and because of this, the remaining surface protective layer partly suffers from heat decomposition to have a cracks therein, wherein moisture penetrates into the inside through the cracks to exert a negative influence on the solar cell.

From a comparison of the solar cell module obtained in Example 1 with the solar cell module obtained in Example 4 and of the solar cell module obtained in Example 5 with the solar cell module obtained in Example 8 with reference to the results shown in Table 1, it is understood that making the distance between the heat-fused portion and the corresponding end portion of the solar cell relatively short leads to some deterioration of the initial photoelectric conversions efficiency. As for the reason for this situation, it is considered that such a heat-fused portion that is insufficient in terms of adhesion (specifically, 10 Kgf/25 mm) is provided because the heat fusion between the surface protective layer and back face protective layer is difficult to be carried out, whereby moisture penetrates into the inside through the incomplete heat-fused portion to exert a negative influence on the solar cell.

With reference to the results shown in Table 1, it is understood that of the solar cell modules obtained in Examples 1 to 12, the ones obtained in Examples 2 and 6 are the lowest in terms of the initial photoelectric conversion efficiency but each of these two solar cell modules is excellent in terms of the deterioration of the initial photoelectric conversion efficiency after exposure. Thus, in each of these two solar cell modules, it is considered that their heat-fused portions are formed in a desirable state. As for the thermal conductivity, and fixing the resultant on a back face reinforcing member having a relatively low thermal conductivity using an adhesive, as apparent from the description of Example 11.

From the above description, it is apparently understood that according to the present invention, there is provided an improved, highly reliable solar cell module which excels particularly in moisture resistance and which stably and continuously exhibits a desirable photoelectric conversion efficiency without being deteriorated even upon repeated use over a long period of time under severe environmental conditions.

TABLE 1

| | initial photoelectric conversion efficiency | photoelectric conversion efficiency after exposure (relative value (in percentage) to the initial photoelectric conversion efficiency) | adhesion of the heat-fused portion | thermal conductivity of the back face reinforcing member |
|---|---|---|---|---|
| Example 1 | 8.9% | 93% | 18 Kgf/25 mm | 40 W/m · K · s |
| Example 2 | 8.0% | 94% | 19 Kgf/25 mm | 40 W/m · K · s |
| Example 3 | 8.8% | 91% | 11 Kgf/25 mm | 40 W/m · K · s |
| Example 4 | 8.9% | 90% | 10 Kgf/25 mm | 40 W/m · K · s |
| Example 5 | 8.9% | 97% | 18 Kgf/25 mm | 40 W/m · K · s |
| Example 6 | 8.0% | 98% | 18 Kgf/25 mm | 40 W/m · K · s |
| Example 7 | 8.7% | 92% | 12 Kgf/25 mm | 40 W/m · K · s |
| Example 8 | 8.8% | 91% | 10 Kgf/25 mm | 40 W/m · K · s |
| Example 9 | 8.5% | 90% | 17 Kgf/25 mm | 40 W/m · K · s |
| Example 10 | 8.7% | 92% | 19 Kgf/25 mm | — |
| Example 11 | 8.8% | 95% | 19 Kgf/25 mm | 20 W/m · K · s |
| Example 12 | 8.7% | 89% | 18 Kgf/25 mm | 40 W/m · K · s |
| Comparative Example 1 | 8.7% | 79% | — | — |
| Comparative Example 2 | 8.8% | 75% | — | — |
| Comparative Example 3 | 8.6% | 70% | — | — | reasons why these two solar cell modules are inferior in terms of the initial photoelectric conversion efficiency, it is considered that the thickness of the filler between the surface protective layer and back face protective layer which is dedicated for heat fusion is relatively thin and because of this, the solder of the serial connection portions are influenced by the thermal energy caused upon conducting the heat fusion process and case an increase in the electric resistance.

It is understood that when no back face reinforcing member is used as in the case of the solar cell module obtained in Example 10, it is possible to form a desirable heat-fused portion using a member having a relatively high thermal conductivity so that a desirable solar cell module excelling not only in terms of the initial photoelectric conversion efficiency but also in terms of the photoelectric conversion efficiency after exposure is provided, as apparent form the description of Example 10.

Further, it is understood that even in the case of using a back face reinforcing member having a relatively low thermal conductivity, a desirable solar cell module excelling not only in initial photoelectric conversion efficiency but also in photoelectric conversion efficiency after exposure can be obtained by providing a stacked body comprising a surface protective layer/a filler/a solar cell/a filler/a back face protective layer, followed by subjecting the stacked body to heat fusion treatment on a member having a relatively high In the claims:

1. A solar cell module comprising a solar cell encapsulated via a filler between a front surface protective layer and a back face protective layer, and a back face reinforcing member disposed on a backside of said solar cell, characterized in that said front surface protective layer has a heat fused portion formed by way of heat fusion welding between said front surface protective layer and said back face protective layer at at least one side end portion of said solar cell module, and said back face reinforcing member has a bent portion situated outside said heat fused portion.

2. A solar cell module according to claim 1, wherein the solar cell module has a heat-fused portion at two or more side end portions thereof.

3. A solar cell module according to claim 1, wherein the heat-fused portion is formed by subjecting the front surface protective layer, filler, and back face protective layer to heat fusion treatment to thereby weld the front surface protective layer and back face protective layer together while melting out the filler.

4. A solar cell module according to claim 3, wherein the heat fusion treatment is conducted by means of ultrasonic bonding.

5. A solar cell module according to claim 3, wherein the filler is selected for the heat fusion treatment and is of a thickness corresponding to a value in terms of μm in the range obtained on the basis of the equation: (the thickness of the solar cell)+75 μm to 1400 μm.

6. A solar cell module according to claim 3, wherein the heat-fused portion is situated at a position which is at a distance in μm corresponding to a value obtained on the basis of the equation: (the thickness of the filler dedicated for the heat fusion treatment)×0.8, from the corresponding end portion if the solar cell.

7. A solar cell module according to claim 1, wherein the heat-fused portion exhibits an adhesion of 10 Kgf/25 mm width in a 180° peel test in which the adhesion is determined by cutting a portion of the heat-fused portion comprising the surface protective layer and back face protective layer welded to each other to obtain a test sample having a width of 25 mm, and pulling the surface protective layer and back face protective layer relative to each other in opposite directions at 180° under conditions of 80° C. and 85% Rh.

8. A solar cell module according to claim 1, wherein the front surface protective layer comprises a film made of a fluorine-containing resin, and the back face protective layer comprises a film made of nylon or polyethylene terephthalate.

9. A solar cell module according to claim 8, wherein the fluorine-containing resin for the front surface protective layer is a resin selected from the group consisting of polyethylenetetrafluoroethlene, polyethylenetrifluoride, and polyvinyl fluoride.

10. A solar cell module according to claim 1, wherein the filler comprises a material having a light-transmitting property, thermoplasticity, and weatherability.

11. A solar cell module according to claim 10, wherein the material constituting the filler is selected from the group consisting of vinyl acetate-ethylene copolymer, butyral resin, silicone resin, epoxy resin, and fluorinated polyimide resin.

12. A solar cell module according to claim 1, wherein the solar cell includes a photoelectric conversion semiconductor layer composed of a single crystal silicon semiconductor material, a non-single crystal silicon semiconductor material, or a compound semiconductor material.

13. A solar cell module according to claim 12, wherein the photoelectric conversion semiconductor layer comprises a stacked structure with a pn junction, a pin junction, or a Schottky type junction.

14. A solar cell module according to claim 1 which further comprises a moisture preventive layer disposed above the solar cell and facing the front surface protective layer.

15. A solar cell module according to claim 14, wherein the moisture preventive layer comprises a film formed of a paint comprising acrylic resin and silicone polymer, or an inorganic oxide-containing paint.

16. A solar cell module according to claim 14, wherein the moisture preventive layer comprises a film formed of silicon dioxide.

17. A solar cell module according to claim 1 which further comprises a moisture preventive layer disposed so as to encircle the solar cell except for the side facing the back face protective layer.

18. A solar cell module according to claim 17, wherein the moisture preventive layer comprises a film formed of a paint comprising acrylic resin and silicone polymer, or an inorganic oxide-containing paint.

19. A solar cell module according to claim 17, wherein the moisture preventive layer comprises a film formed of silicon dioxide.

20. A solar cell module according to claim 1, wherein the back face reinforcing member comprises a member selected for good weatherability, rigidity, flexibility, and thermal conductivity.

21. A solar cell module according to claim 20, wherein the member constituting the back face reinforcing member is of 30 W/m.K.s. or more, with m being a minute, I being 1° C. and s being a second, in coefficient of thermal conductivity at 300° C.

22. A solar cell module according to claim 20, wherein the member constituting the back face reinforcing member comprises a metal sheet or a zinc-coated steel sheet.

23. A solar cell module according to claim 1, wherein a filler is interposed between the back face protective layer and the back face reinforcing member.

24. A solar cell module according to claim 23, wherein the filler comprises a material selected from the group consisting of vinyl acetate-ethylene copolymer, butyral resin, silicone resin, epoxy resin, and fluorinated polyamide resin.

25. A solar cell module according to claim 1, wherein the bent portion of the back face reinforcing member is formed by bending the back face reinforcing member at an end portion thereof free of the solar cell, which is situated outside the heat fused portion.

26. A solar cell module comprising a solar cell encapsulated via a filler between a front surface protective layer and a back face protective layer, and a back face reinforcing member disposed on a backside of said solar cell, said solar cell comprising a plurality of series connected solar cell elements, characterized in that said front surface protective layer has a heat fused portion formed by way of heat fusion welding between said front surface protective layer and said back face protective layer at at least one side end portion of said solar cell module, and said back face reinforcing member has a bent portion outside said heat fused portion.

27. A solar cell module according to claim 26, wherein the solar cell module has a heat-fused portion at two or more side end portions thereof.

28. A solar cell module according to claim 26, wherein the heat-fused portion is formed by subjecting the surface protective layer, filler, and back face protective layer to heat fusion treatment to thereby weld the front surface protective layer and back face protective layer together while melting out the filler.

29. A solar cell module according to claim 28, wherein the heat fusion treatment is conducted by means of ultrasonic bonding.

30. A solar cell module according to claim 28, wherein the filler is selected for the heat fusion treatment and is of a thickness corresponding to a value in terms of μm in the range obtained on the basis of the equation: (the thickness of the solar cell)+75 μm to 1400 μm.

31. A solar cell module according to claim 28, wherein the heat-fused portion is situated at a position which is at a distance in μm corresponding to a value obtained on the basis of the equation: (the thickness of the filler dedicated for the heat fusion treatment)×0.8, from the corresponding end portion of the solar cell.

32. A solar cell module according to claim 26, wherein the heat-fused portion exhibits an adhesion of 10 Kgf/25 mm width in a 180° peel test in which the adhesion is determined by cutting a portion of the heat-fused portion comprising the surface protective layer and back face protective layer welded to each other to obtain a test sample having a width of 25 mm, and pulling the surface protective layer and back face protective layer relative to each other in opposite directions at 180° under conditions of 85° C. and 85% Rh.

33. A solar cell module according to claim 26, wherein the front surface protective layer comprises a film made of a fluorine containing resin, and the back face protective layer comprises a film made of nylon or polyethylene terephthalate.

34. A solar cell module according to claim 33, wherein the fluorine-containing resin of the front surface protective layer is a resin selected form the group consisting of polyethylenetetrafluoroethylene, polyethylenetrifluoride, and polyvinyl fluoride.

35. A solar cell module according to claim 26, wherein the filler comprises a material having a light-transmitting property, thermoplasticity, and weatherability.

36. A solar cell module according to claim 35, wherein the material constituting the filler is selected from the group consisting of vinyl acetate-ethylene copolymer, butyral resin, silicone resin, epoxy resin, and fluorinated polyimide resin.

37. A solar cell module according to claim 26, wherein each of the solar cell elements constituting the solar cell includes a photoelectric conversion semiconductor layer composed of a single crystal silicon semiconductor material, a non-single crystal silicon semiconductor material, or a compound semiconductor material.

38. A solar cell module according to claim 37, wherein the photoelectric conversion semiconductor layer comprises a stacked structure with a pn junction, a pin junction, or a Schottky type junction.

39. A solar cell module according to claim 26 which further comprises a moisture preventive layer disposed above the solar cell and facing the front surface protective layer side.

40. A solar cell module according to claim 39, wherein the moisture preventive layer comprises a film formed of a paint comprising acrylic resin and silicon polymer, or an inorganic oxide-containing paint.

41. A solar cell module according to claim 39, wherein the moisture preventive layer comprises a film formed of silicon dioxide.

42. A solar cell module according to claim 26 which further comprises a moisture preventive layer disposed so as to encircle the solar cell except for the side facing the back face protective layer.

43. A solar cell module according to claim 42, wherein the moisture preventive layer comprises a film formed of a paint comprising acrylic resin and silicon polymer, or an inorganic oxide-containing paint.

44. A solar cell module according to claim 42, wherein the moisture preventive layer comprises a film formed of silicon dioxide.

45. A solar cell module according to claim 26, wherein the back face reinforcing member comprises a member selected for good weatherability, rigidity, flexibility, and thermal conductivity.

46. A solar cell module according to claim 45, wherein the member constituting the back face reinforcing member is of 30 W/m.K.s. or more, with m being a minute, K being 1° C. and s being a second, in coefficient of thermal conductivity at 300° C.

47. A solar cell module according to claim 45, wherein the member constituting the back face reinforcing member comprises a metal sheet or a zinc-coated steel sheet.

48. A solar cell module according to claim 26, wherein a filler is interposed between the back face protective layer and the back face reinforcing member.

49. A solar cell module according to claim 48, wherein the filler comprises a material selected form the group consisting of vinyl acetate-ethylene copolymer, butyral resin, silicone resin, epoxy resin, and fluorinated polyimide resin.

50. A solar cell module according to claim 26, wherein the bent portion of the back face reinforcing member is formed bending the back face reinforcing member at a solar cell-free end portion side thereof, which is situated outside the heat fused portion.

51. A solar cell module comprising:
(a) a solar cell comprising a photoelectric conversion semiconductor layer and having a light receiving surface through which light is impinged,
(b) an encapsulating member comprising:
(b-i) a transparent first layer disposed on said light receiving surface of said solar cell; and
(b-ii) a second layer disposed on a backside of said solar cell,
wherein said solar cell is encapsulated between said first layer (b-i) and said second layer (b-ii), said first layer (b-i) and second layer (b-ii) are formed to establish a region such that said region includes an end portion of said solar cell, and said region has a sealing portion including a heat fused portion formed between said first and second layers so as to seal said solar cell, and
(c) a back face reinforcing member laminated to said encapsulating member (b), said back face reinforcing member having a bent portion that is outside said heat fused portion.

52. A solar cell module according to claim 51, wherein the heat fused portion is formed by way of heat fusion welding between the first layer and the second layer.

53. A solar cell module according to claim 51 which further comprises a filler member disposed between the first layer and the second layer.

54. A solar cell module according to claim, 51, wherein the bent portion of the back face reinforcing member is formed by bending the back face reinforcing member at a solar cell-free end portion thereof, which is situated outside the heat fused portion.

55. A solar cell module according to claim 51, wherein the back face reinforcing member comprises a metal sheet.

56. A solar cell module according to claim 51, wherein the solar cell comprises a plurality of solar cells integrated in series connection.

57. A power generating device comprising a solar cell module having a pair of terminals and power wiring means connected to said pair of terminals, said solar cell module comprising:
(a) a solar cell comprising a photoelectric conversion semiconductor layer and having a light receiving surface through which light is impinged,
(b) an encapsulating member comprising:
(b-i) a transparent first layer disposed on said light receiving surface of said solar cell; and
(b-ii) a second layer disposed on a backside of said photoelectric conversion layer,
wherein said solar cell is encapsulated between said first layer (b-i) and said second layer (b-ii), said first layer (b-i) and second layer (b-ii) are formed to establish a region such that said region includes an end portion of said solar cell, and said region has a sealing portion comprising a heat fused portion formed between said first and second layers so as to seal said solar cell, and
(c) a back face reinforcing member laminated to said encapsulating member (b), said back face reinforcing member having a bent portion situated outside of said heat fused portion.

58. A solar cell module for placement on a roof member, wherein said solar cell module comprises:
(a) a solar cell comprising a photoelectric conversion semiconductor layer and having a light receiving surface through which light is impinged, (b) an encapsulating member comprising:
- (b-i) a transparent first layer disposed on said light receiving surface of said solar cell; and
- (b-ii) a second layer disposed on a backside of said photoelectric conversion layer, wherein said solar cell is encapsulated between said first layer (b-i) and said second layer (b-ii), said first layer (b-i) and second layer (b-ii) are formed to establish a region such that said region includes an end portion of said solar cell, and said region has a sealing portion including a heat fused portion formed between said first and second layers so as to seal said solar cell, and (c) a back face reinforcing member laminated to said encapsulating member (b), said back face reinforcing member having a bent portion situated outside of said heat fused portion.

* * * * *

UNITED STATES PATENT AND TRADEMARK OFFICE
CERTIFICATE OF CORRECTION

PATENT NO. : 5,707,459
DATED : January 13, 1998
INVENTOR(S) : Shigenori Itoyama et al.

It is certified that error appears in the above-identified patent and that said Letters Patent is hereby corrected as shown below:

COLUMN 1

Line 10, "excel" should read --excels--;
    Line 22, "include" should read --includes--; and
    Line 38, "damages." should read --damaged.--.

COLUMN 3

Line 27, "place" should read --placed--; and
    Line 54, "results," should read --results.--.

COLUMN 7

Line 8, "portion at" should read --portion at at--; and
    Line 12, "comprises" should read --comprise--.

UNITED STATES PATENT AND TRADEMARK OFFICE
CERTIFICATE OF CORRECTION

PATENT NO. : 5,707,459
DATED : January 13, 1998
INVENTOR(S) : Shigenori Itoyama et al.

Page 2 of 5

It is certified that error appears in the above-identified patent and that said Letters Patent is hereby corrected as shown below:

COLUMN 10

Line 22, "sputtering;" should read --sputtering,--.

COLUMN 16

Line 10, "amount" should read --amount of--.

COLUMN 17

Line 28, "Moday" should read --Mobay--.

COLUMN 18

Line 50, "subjected" should read --subjected to--; and
    Line 58, "exposure" should read --exposure;--.

UNITED STATES PATENT AND TRADEMARK OFFICE
CERTIFICATE OF CORRECTION

PATENT NO. : 5,707,459
DATED : January 13, 1998
INVENTOR(S) : Shigenori Itoyama et al.

It is certified that error appears in the above-identified patent and that said Letters Patent is hereby corrected as shown below:

COLUMN 19

Line 2, "thin" should read --in--.

COLUMN 21

Line 49, "there by" should read --thereby--.

COLUMN 26

Line 46, "fomed" should read --formed--; and
    Line 62, "conversions" should read --conversion--.

UNITED STATES PATENT AND TRADEMARK OFFICE
CERTIFICATE OF CORRECTION

PATENT NO.  : 5,707,459
DATED       : January 13, 1998
INVENTOR(S) : Shigenori Itoyama et al.

It is certified that error appears in the above-identified patent and that said Letters Patent is hereby corrected as shown below:

COLUMN 27

Line 53, "Cooperative" should read --Comparative--.

COLUMN 28

Line 21, "fomed" should read --formed-- and "form" should read --from--;
    Line 32, "ben" should read --bent--;
    Line 47, "efficiency," should read --efficiency.--; and
    Line 52, "a" should be deleted.

COLUMN 29

Line 46, "case" should read --cause--.

UNITED STATES PATENT AND TRADEMARK OFFICE
CERTIFICATE OF CORRECTION

PATENT NO. : 5,707,459
DATED : January 13, 1998
INVENTOR(S) : Shigenori Itoyama et al.

It is certified that error appears in the above-identified patent and that said Letters Patent is hereby corrected as shown below:

COLUMN 31

```
Line 4,  "if" should read --of--;
Line 22, "polyethylenetetrafluoroethlene," should
         read --polyethylenetetrafluoroethylene,--;
Line 41, "claim 1" should read --claim 1,--; and
Line 51, "claim 1" should read --claim 1,--.
```

COLUMN 33

```
Line 22, "claim 26" should read --claim 26,--; and
Line 33, "claim 26" should read --claim 26,--.
```

COLUMN 34

```
Line 25, "claim 51" should read --claim 51,--.
```

Signed and Sealed this

First Day of September, 1998

Attest:

BRUCE LEHMAN

Attesting Officer          Commissioner of Patents and Trademarks